(12) United States Patent
Xiao

(10) Patent No.: US 12,256,617 B2
(45) Date of Patent: Mar. 18, 2025

(54) DISPLAY PANEL AND DISPLAY DEVICE

(71) Applicant: WuHan TianMa Micro-electronics CO., LTD., Wuhan (CN)

(72) Inventor: Ai Xiao, Wuhan (CN)

(73) Assignee: WuHan TianMa Micro-electronics CO., LTD., Wuhan (CN)

( * ) Notice: Subject to any disclaimer, the term of this patent is extended or adjusted under 35 U.S.C. 154(b) by 219 days.

(21) Appl. No.: 17/356,425

(22) Filed: Jun. 23, 2021

(65) Prior Publication Data

US 2021/0320157 A1     Oct. 14, 2021

(30) Foreign Application Priority Data

Feb. 9, 2021 (CN) .......................... 202110177248.5

(51) Int. Cl.
*H10K 59/35*   (2023.01)
*G09G 3/3225*  (2016.01)
(Continued)

(52) U.S. Cl.
CPC ......... *H10K 59/353* (2023.02); *G09G 3/3225* (2013.01); *H10K 50/818* (2023.02); *H10K 50/865* (2023.02)

(58) Field of Classification Search
None
See application file for complete search history.

(56) References Cited

U.S. PATENT DOCUMENTS 10,276,822 B2 * 4/2019 Kim ............... H10K 50/814
2014/0292622 A1 * 10/2014 Lee ............... G09G 3/3233
                                                           345/80

(Continued)

FOREIGN PATENT DOCUMENTS

| CN | 108986739 A | 12/2018 |
| CN | 111326636 A | 6/2020 |
| CN | 211150599 U | 7/2020 |

OTHER PUBLICATIONS

State Intellectual Property Office of the People's Republic of China, First Office Action, Chinese Application No. 2021101774248.5, Mailed Apr. 15, 2022, 13 pages.

*Primary Examiner* — Erik T. K. Peterson
*Assistant Examiner* — Christopher A. Schodde
(74) *Attorney, Agent, or Firm* — CHRISTENSEN O'CONNOR JOHNSON KINDNESS PLLC

(57) ABSTRACT

A display panel includes a substrate, sub-pixels, and a black matrix. Each sub-pixel includes a pixel drive circuit and a light-emitting element. The light-emitting element includes an anode connected to M trace lead-out ends. At least portion of the trace lead-out end is electrically connected to pixel drive circuit through connection trace, M≥1. The black matrix has openings where the anode is exposed. The portion of the trace lead-out end exposed in the opening is a connection end. The sub-pixels include first and second sub-pixels having different light-emitting colors. In the first sub-pixel, M connection ends include at least one first connection end. In the second sub-pixel, M connection ends include at least one second connection end. Extension directions of first connection ends are parallel to extension direction of one second connection end, respectively. The first and second connection ends having parallel extension directions have similar profiles.

13 Claims, 18 Drawing Sheets

(51) Int. Cl.
*H10K 50/818* (2023.01)
*H10K 50/86* (2023.01)

(56) References Cited

U.S. PATENT DOCUMENTS

| | | | | |
|---|---|---|---|---|
| 2015/0102320 A1* | 4/2015 | Jung | ............... | H10K 59/353 |
| | | | | 257/40 |
| 2015/0200237 A1* | 7/2015 | Yim | ............... | H10K 59/122 |
| | | | | 257/40 |
| 2016/0124557 A1* | 5/2016 | Choi | ............... | H10K 59/40 |
| | | | | 345/173 |
| 2018/0183008 A1* | 6/2018 | Song | ............... | H10K 59/121 |
| 2022/0310709 A1* | 9/2022 | Zhang | ............... | H10K 59/123 |

* cited by examiner

DISPLAY PANEL AND DISPLAY DEVICE

CROSS-REFERENCE TO RELATED APPLICATIONS

The present application claims priority to Chinese Patent Application No. 202110177248.5, filed on Feb. 9, 2021, the content of which is incorporated herein by reference in its entirety.

TECHNICAL FIELD

The present disclosure relates to the field of display technologies, and in particular, to a display panel and a display device.

BACKGROUND

Organic light-emitting diode (OLED) display panels have been widely used based on their excellent characteristics such as high brightness, high efficiency, wide viewing angle, and autonomous luminescence.

A substrate of the OLED display panel is sequentially provided with an array layer and an optical filter. The optical filter includes a color filter and a black matrix. The black matrix is provided with a plurality of openings for defining a light-emitting region of the panel. When ambient light is emitted into the panel through the openings, it is reflected back by a metal layer exposed in the opening, such as an anode of a light-emitting element and a part of connection traces connected to the anode. The reflection light interferes and further generates a diffraction image.

In the related art, the diffraction image presented by the entire panel has significant color separation, and visually presents observable rainbow fringes, which adversely affects users' viewing experience.

SUMMARY

In view of this, the present disclosure provides a display panel and a display device, which effectively improve color separation problem of diffraction image of the panel and weaken the rainbow fringe phenomenon.

In a first aspect of the present disclosure provide a display panel, includes a substrate, an array layer located on the substrate and including a plurality of sub-pixels, and a black matrix located at a side of the array layer facing away from the substrate and having a plurality of openings. Each of the plurality of sub-pixels includes a pixel drive circuit and a light-emitting element, the light-emitting element of each of the plurality of sub-pixels includes an anode electrically connected to M trace lead-out ends, and at least a part of the M trace lead-out ends is electrically connected to the pixel drive circuit by connection traces, where M≥1, and M is an integer. The anode of the light-emitting element of each of the plurality of sub-pixels is exposed in a respective one of the plurality of openings. A portion of each of the M trace lead-out ends that is exposed in the opening is a connection end, and the sub-pixel includes a first sub-pixel and a second sub-pixel that have different light-emitting colors. In the first sub-pixel, at least one of M connection ends is a first connection end. In the second sub-pixel, at least one of M connection ends is a second connection end. Extension directions of respective first connection ends are respectively parallel to an extension direction of one second connection end, and the first connection end, and the second connection end that have parallel extension directions have similar profiles.

In a second aspect of the present disclosure, a display device is provided, the display device includes any of the display panels described in the embodiments.

BRIEF DESCRIPTION OF DRAWINGS

In order to better illustrate technical solutions of embodiments of the present disclosure, the accompanying drawings used in the embodiments are briefly described below. The drawings described below are merely a part of the embodiments of the present disclosure. Based on these drawings, those skilled in the art may also obtain other drawings.

DESCRIPTION OF EMBODIMENTS

In order to better understand technical solutions of the present disclosure, the embodiments of the present disclosure are described in detail with reference to the drawings.

It should be clear that the described embodiments are merely a part of the embodiments of the present disclosure rather than all of the embodiments. All other embodiments obtained by those skilled in the art shall fall into the protection scope of the present disclosure.

The terms used in the embodiments of the present disclosure are merely for the purpose of describing specific embodiments, rather than limiting the present disclosure. The terms "a", "an", "the" and "said" in a singular form in the embodiments of the present disclosure and the attached claims are also intended to include plural forms thereof, unless noted otherwise.

It should be understood that the term "and/or" used in the context of the present disclosure is to describe a correlation relation of related objects, indicating that there may be three relations, e.g., A and/or B may indicate only A, both A and B, and only B. In addition, the symbol "/" in the context generally indicates that the relation between the objects before and after the "/" is an "or" relation.

Before describing technical solutions provided by embodiments of the present disclosure, the problems existing in the related art is firstly explained in the present disclosure.

In the related art, along a light-emitting direction of a display panel, a substrate of the display panel is sequentially provided with a pixel drive circuit, a planarization layer, a light-emitting element, and a black matrix. The black matrix is provided with a plurality of openings. The light emitted from the light-emitting element exits through the opening, thereby achieving normal image display.

Figure 1:
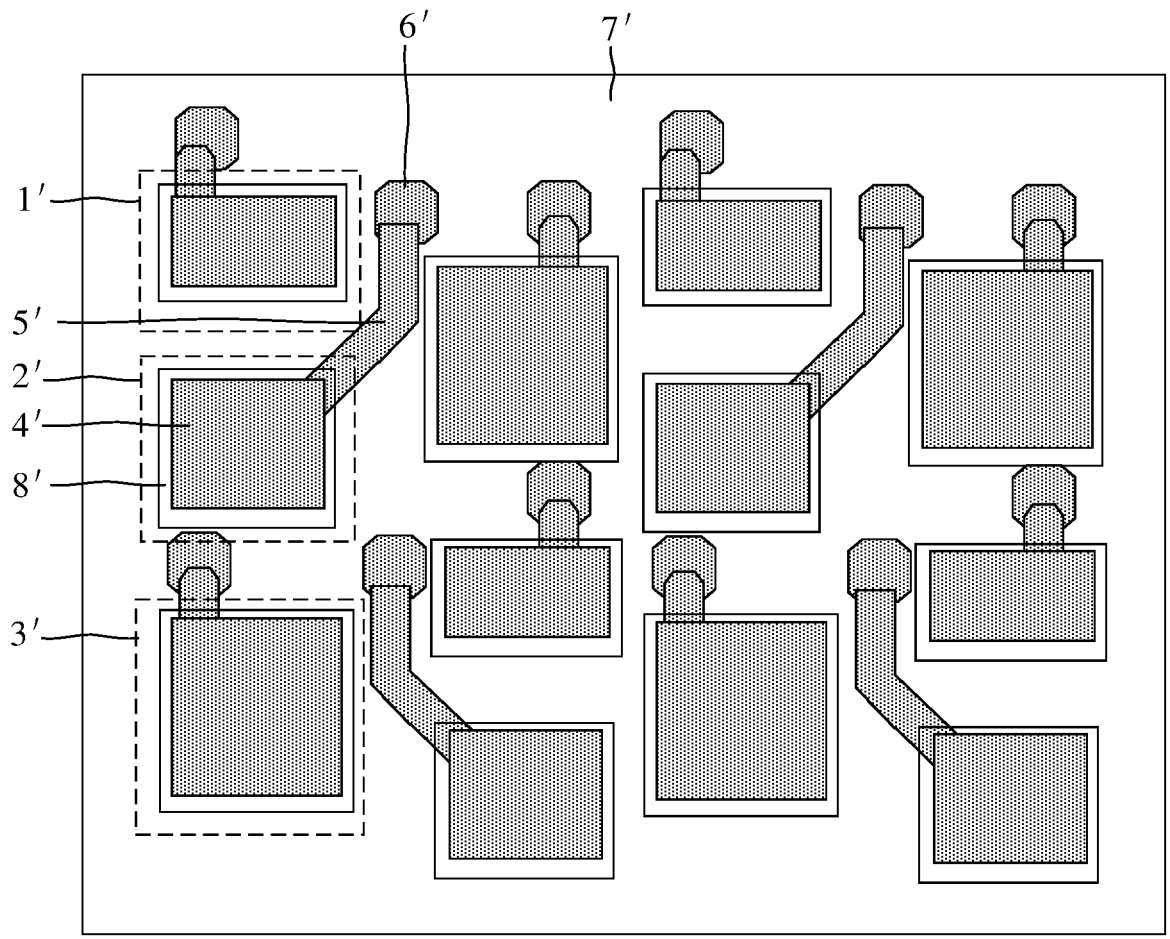
FIG. 1 is a schematic diagram showing connection of anodes in sub-pixels having different colors in the related art.
Figure 2:
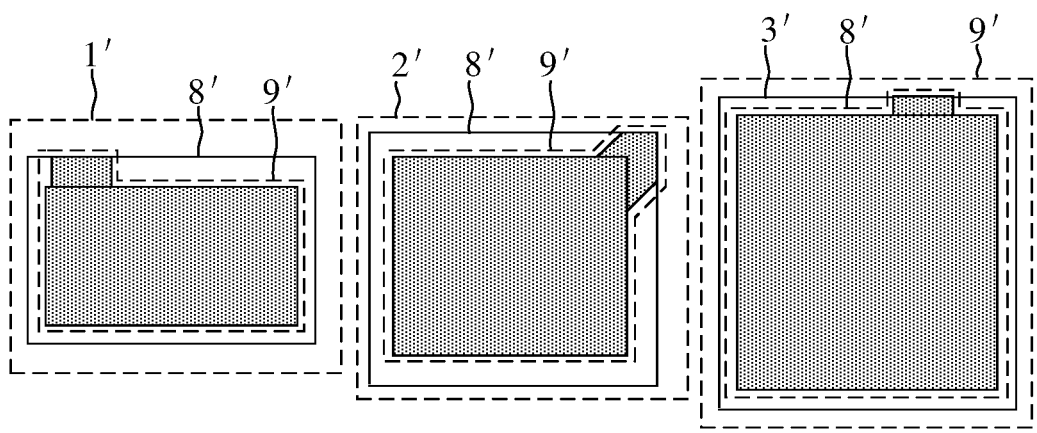
FIG. 2 is a structural schematic diagram showing reflective electrodes in sub-pixels having different colors in the related art.

FIG. 1 is a schematic diagram showing connection of anodes in sub-pixels having different colors in the related art, and FIG. 2 is a structural schematic diagram showing reflective electrodes in sub-pixels having different colors in the related art. As shown in FIG. 1 and FIG. 2, taking a display panel that includes a red sub-pixel 1', a green sub-pixel 2' and a blue sub-pixel 3' as an example, light-emitting elements in the red sub-pixel 1', the green sub-pixel 2' and the blue sub-pixel 3' respectively include an anode 4'. The anode 4' is connected to a connection trace 5'. The connection trace 5' is further connected to a pixel drive circuit through a through hole 6' in a planarization layer. The anode 4' and a portion of the connection trace 5' connected to the anode 4' are exposed in an opening 8' of a black matrix 7'.

In a current layout design, positions of the anode 4' in the sub-pixels having different colors relative to the through hole 6' corresponding to the anode 4' are different. Therefore, the anodes 4' in the sub-pixels having different colors are required to be connected to the connection traces 5' at different positions, so that the reflective electrodes 9' formed by the anode 4' exposed in the opening 8' in the sub-pixels having different colors and the connection trace 5' have different patterns.

Figure 3:
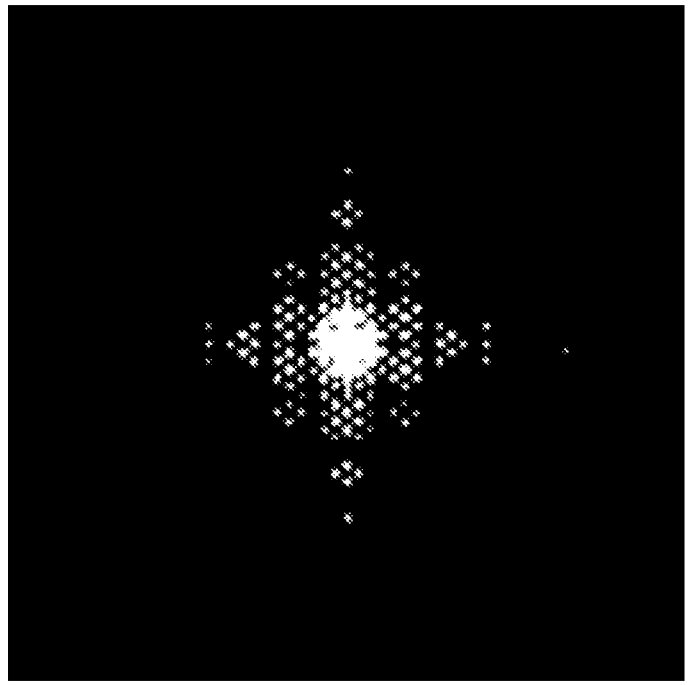
FIG. 3 is a schematic diagram showing distribution of diffraction fringes generated by reflected red light in the related art.
Figure 4:
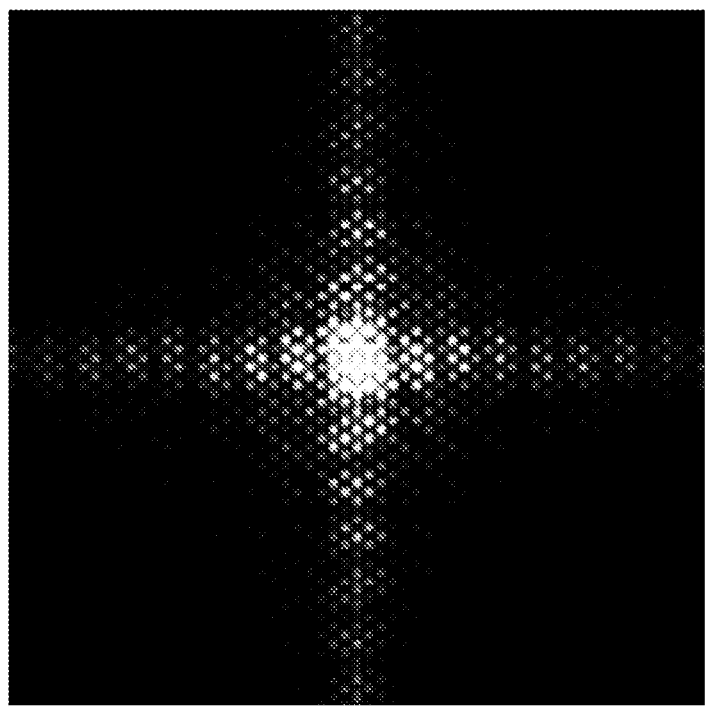
FIG. 4 is a schematic diagram showing distribution of diffraction fringes generated by reflected green light in the related art.

When ambient light is transmitted to the reflective electrode 9' through the opening 8', the ambient light may be reflected back by the reflective electrode 9'. Since the reflective electrodes 9' in the panel are arranged regularly, light reflected by a plurality of reflective electrodes 9' may interfere and further generate diffraction fringes. In the diffraction process, distribution of diffraction fringes may be affected by pattern of the reflective electrode 9'. Since patterns of the reflective electrodes 9' in sub-pixels having different color are different, spatial frequency difference among red light, green light and blue light that are reflected by the reflective electrode 9' is large, and distribution of diffraction fringes generated by reflected red light, green light and blue light is then different. For example, based on pattern of the reflective electrode 9' in the red sub-pixel 1' and the green sub-pixel 2' in FIG. 2, distribution of the diffraction fringes formed after the reflected red light is diffracted as shown in FIG. 3, and distribution of the diffraction fringes formed after the reflected green light is diffracted as shown in FIG. 4. Therefore, diffraction fringes formed by different diffracted lights cannot be better mixed into white light, which exacerbates the problem of poor dispersion of the diffraction image presented by the panel as an entirety, and visually presents obvious rainbow fringes.

Figure 5:
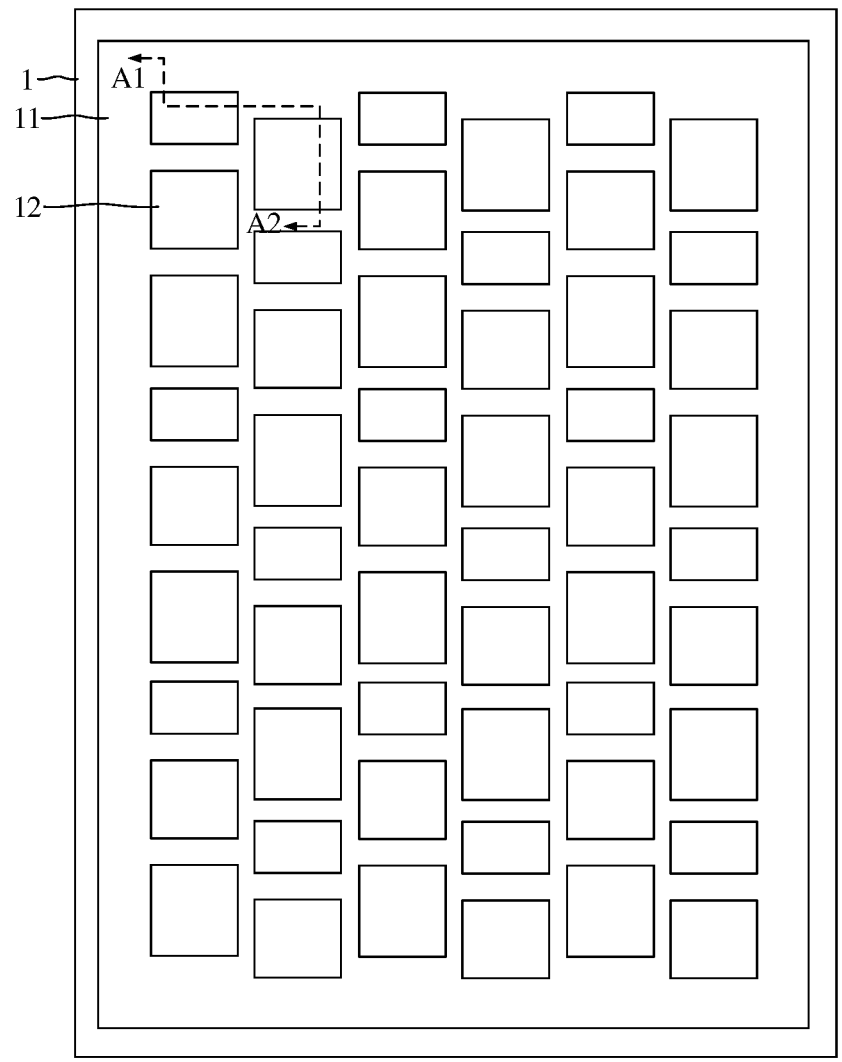
FIG. 5 is a top view of a display panel according to an embodiment of the present disclosure.
Figure 6:
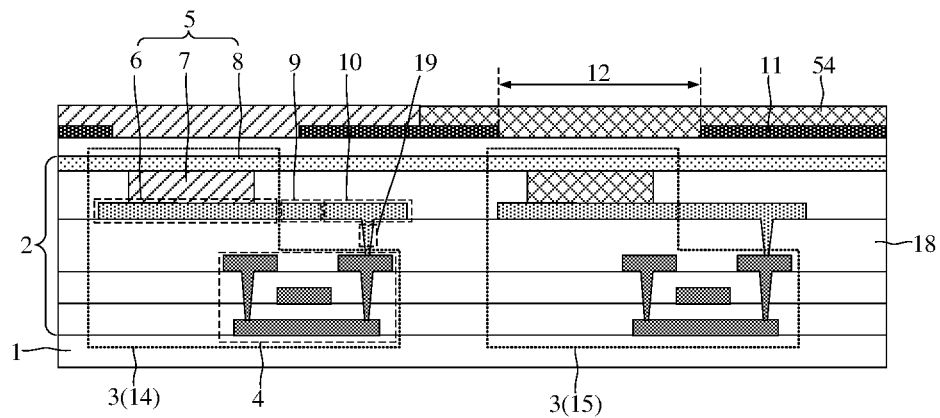
FIG. 6 is a cross-sectional view of the display panel in FIG. 5 along an A1-A2 direction.
Figure 7:
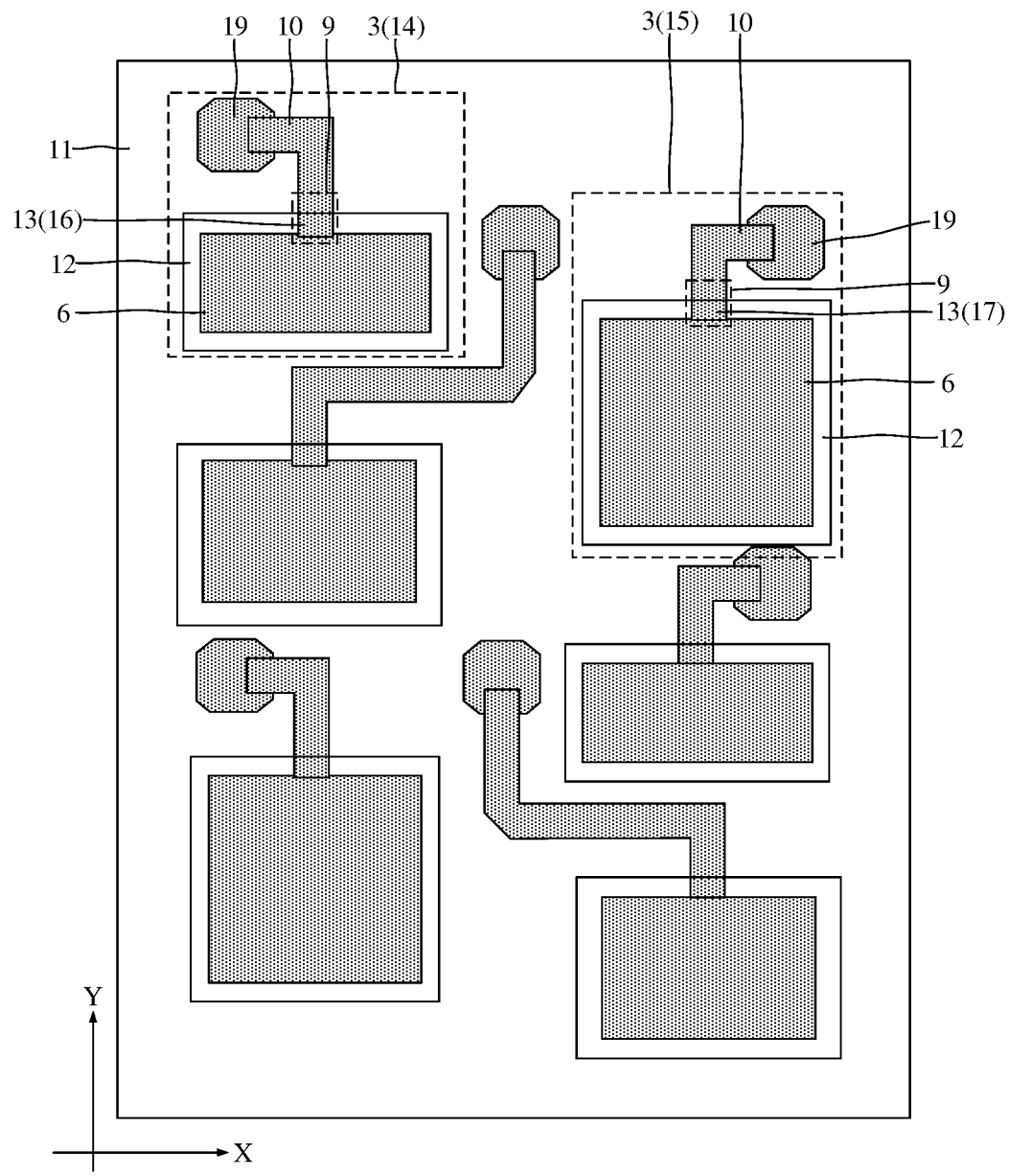
FIG. 7 is a schematic diagram showing connection of an anode when M=1 according to an embodiment of the present disclosure.
Figure 8:
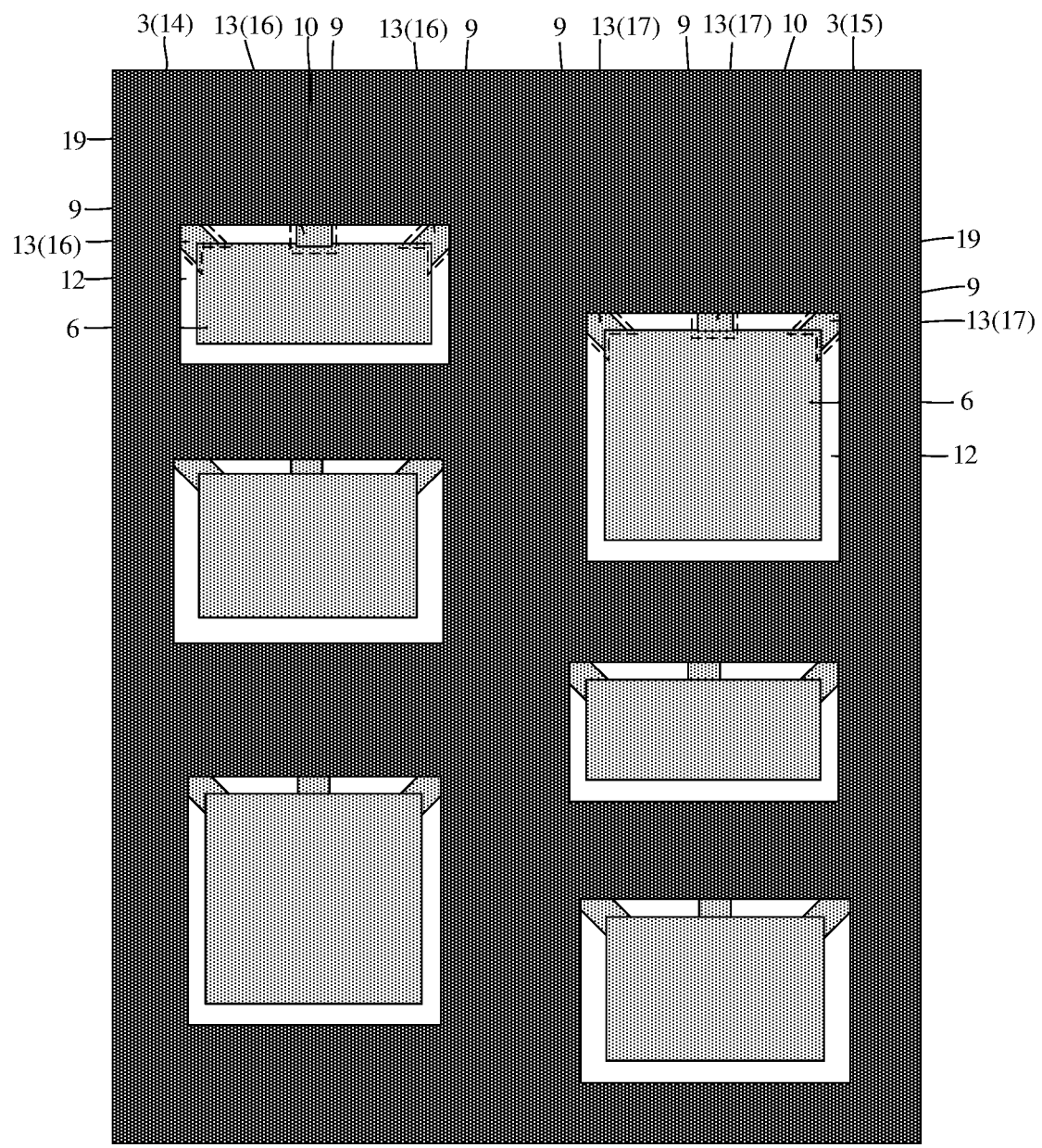
FIG. 8 is a schematic diagram showing connection of an anode when M>1 according to an embodiment of the present disclosure.

In order to solve the above problems, an embodiment of the present disclosure provides a display panel as shown in FIG. 5 to FIG. 8. FIG. 5 is a top view of a display panel according to an embodiment of the present disclosure, FIG. 6 is a cross-sectional view of the display panel in FIG. 5 along an A1-A2 direction, FIG. 7 is a schematic diagram showing connection of an anode when M=1 according to an embodiment of the present disclosure, and FIG. 8 is a schematic diagram showing connection of an anode when M>1 according to an embodiment of the present disclosure. The display panel includes: a substrate 1, and an array layer 2 located on the substrate 1. The array layer 2 includes a plurality of sub-pixels 3. The sub-pixel 3 includes a pixel drive circuit 4 and a light-emitting element 5. A planarization layer 18 is provided between the pixel drive circuit 4 and the light-emitting element 5.

The light-emitting element 5 includes an anode 6, a light-emitting layer 7, and a cathode 8 stacked along a light-emitting direction of the display panel. The anode 6 is electrically connected to M trace lead-out ends 9. At least a part of M trace lead-out ends 9 is electrically connected to a connection trace 10. The connection trace 10 is further electrically connected to the pixel drive circuit 4 by a through hole 19 provided in the planarization layer 18, where M≥1, and M is an integer.

In addition, the display panel further includes a black matrix 11 located at a side of the array layer 2 facing away from the substrate 1. The black matrix 11 has a plurality of openings 12 for defining a light-emitting region of the panel. The anode 6 is exposed in the opening 12. It should be noted that the anode 6 and the black matrix 11 are not arranged in a same layer. The expression "the anode 6 is exposed in the opening 12" means that an orthographic projection of the anode 6 is located in the opening 12 in a direction perpendicular to the plane of the substrate 1. The opening 12 has an area larger than the area of the anode 6 exposed in the opening 12.

Figure 9:
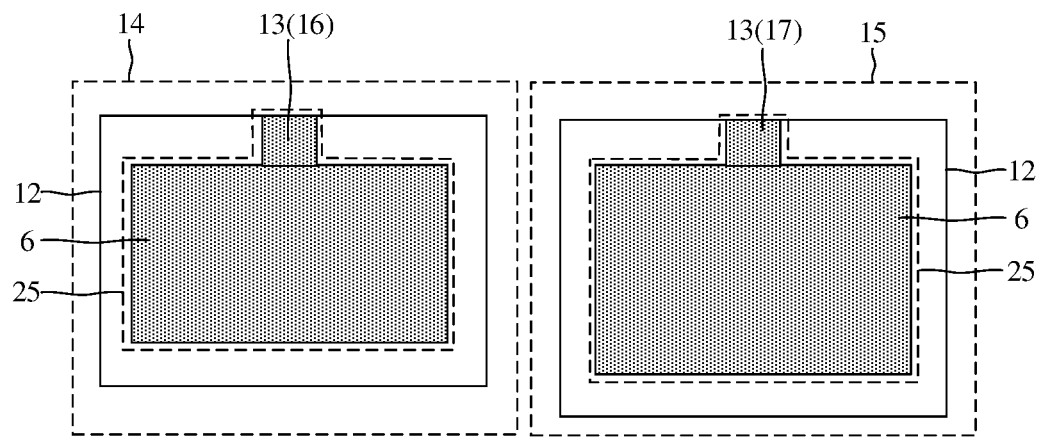
FIG. 9 is a schematic diagram of a connection end corresponding to FIG. 7.
Figure 10:
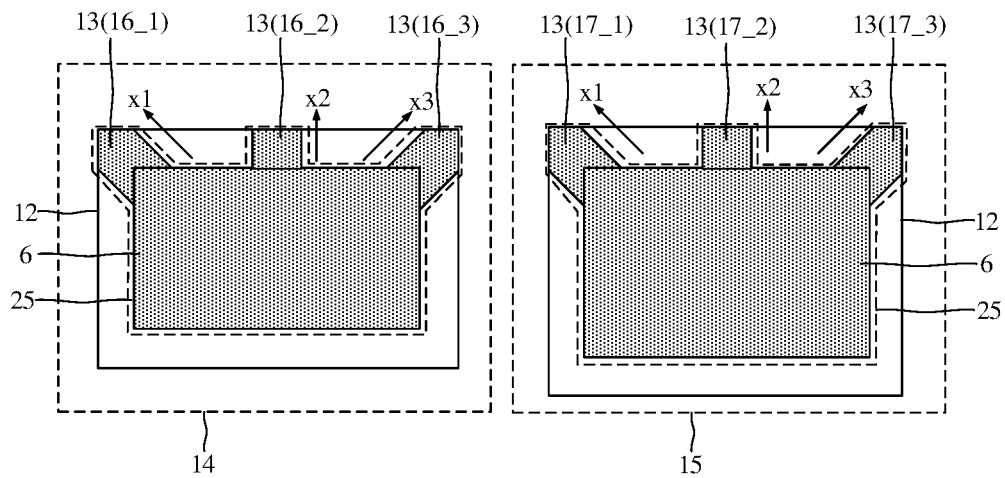
FIG. 10 is a schematic diagram of the connection end corresponding to FIG. 7.

In combination with FIG. 7 and FIG. 8, as shown in FIG. 9 and FIG. 10, FIG. 9 is a schematic diagram of a connection end 13 corresponding to FIG. 7, and FIG. 10 is a schematic diagram of the connection end 13 corresponding to FIG. 7. The portion of the trace lead-out end 9 exposed in the opening 12 is the connection end 13. It should be noted that the trace lead-out end 9 protrudes from the anode 6 and extends in a direction facing away from the anode 6. An orthographic projection of a portion of the trace lead-out end 9 is located in the opening 12 in the direction perpendicular to the plane of the substrate 1, and an orthographic projection of the remaining portion of the trace lead-out end 9 is located outside the opening 12. The lead-out end 9 of this part whose orthographic projection is located in the opening 12 is the connection end 13.

The sub-pixel 3 includes a first sub-pixel 14 and a second sub-pixel 15 that have different light-emitting colors. In the first sub-pixel 14, at least one of the M connection ends 13 is a first connection end 16. In the second sub-pixel 15, at least one of the M connection ends 13 is a second connection end 17. An extension direction of each first connection end 16 is parallel to an extension direction of one second connection end 17. The first connection end 16 and the second connection end 17 that extend in parallel have similar profiles, that is, the corresponding angles of the first connection end 16 and the second connection end 17 that extend in parallel are equal and the corresponding sides thereof are proportional.

It should be noted that the extension direction of the connection end 13 is a direction of an edge of the connection end 13 overlapping with the edge of the anode 6 and facing away from the anode 6, that is, a protruding direction of the connection end 13. Taking FIG. 10 as an example, the extension directions of three first connection ends 16 in the first sub-pixel 14 and the extension directions of three second connection ends 17 in the second sub-pixel 15 are indicated by arrows x1, x2 and x3, respectively.

In an embodiment, when the first connection end 16 and the second connection end 17 have parallel extension directions and have similar profiles, the pattern of the first connection end 16 directly when translated overlaps with the pattern of the second connection end 17; or, the pattern of the first connection end 16, after being scaled up or scaled down and then translated, overlaps with the pattern of the second connection end 17, thereby weakening the difference between patterns of the connection end 13 in the first sub-pixel 14 and the second sub-pixel 15, and further weakening the difference between patterns of the reflective electrodes 25 formed by the anode 6 exposed in the opening 12 and the connection end 13. After the ambient light passes through the opening 12 and is reflected by the reflective electrode 25, the spatial frequency difference of the reflection lights having different colors after being reflected by the reflective electrode 25 is small, and the distribution of the diffraction fringes formed by the reflection light having different colors tends to be uniform. The diffraction fringes are easier to be mixed into white light, thereby effectively improving color separation of the overall diffraction image of the panel, weakening the rainbow fringe phenomenon, and enhancing users' viewing experience.

In addition, referring to FIG. 7 and FIG. 8 again, the relative positions between the through hole 19 and the anode 6 corresponding to the sub-pixels 3 having different colors are different. Therefore, in an embodiment, when M>1, each anode 6 may be provided with a plurality of trace lead-out ends 9 correspondingly, and then according to the position of the through hole 19 corresponding to the anode 6, a suitable trace lead-out end 9 may be selected from the plurality of trace lead-out ends 9 to be connected to the connection trace 10, thereby achieving a more flexible design of the setting position and extension length of the connection trace 10. For example, when the relative positions of the anode 6 and the corresponding through hole 19 in the first sub-pixel 14 and the second sub-pixel 15 are different, the first sub-pixel 14 and the second sub-pixel 15 may select the trace lead-out ends 9 at different positions to be connected to the connection traces 10, thereby reducing the length difference between the connection traces 10 corresponding to the first sub-pixel 14 and the second sub-pixel 15, that is, reducing the load difference of the traces, and further reducing the difference of attenuation degree of the signals during transmission of the connection traces 10.

In an embodiment, referring to FIG. 9 and FIG. 10 again, the M connection ends 13 in the first sub-pixel 14 are all the first connection ends 16, and the M connection ends 13 in the second sub-pixel 15 are all the second connection ends 17. The M first connection ends 16 and the M second connection ends 17 are in one-to-one correspondence. The extension direction of the $i^{th}$ first connection end 16 is parallel to the extension direction of the corresponding $i^{th}$ second connection end 17, and the $i^{th}$ first connection end 16 and the corresponding $i^{th}$ second connection end 17 have similar profiles. When M=1, i=1; and when M>1, i=1, . . . , M.

It should be noted that, referring to FIG. 10 again, when M>1, in order to understand the solution more clearly, the reference numeral 16_i is presented in the drawings to indicate the $i^{th}$ first connection end 16, and the reference numeral 17_i is presented in the drawings to indicate the $i^{th}$ second connection end 17.

With the above arrangement, the difference between the overall patterns of the connection ends 13 in the first sub-pixel 14 and the second sub-pixel 15 is further reduced, and the difference between patterns of the reflective electrode 25 in the first sub-pixel 14 and the second sub-pixel 15 are further reduced. The distribution of the diffraction fringes formed by the reflection light having different colors tends to be uniform, thereby improving color separation of the overall diffraction image of the panel.

Figure 11:
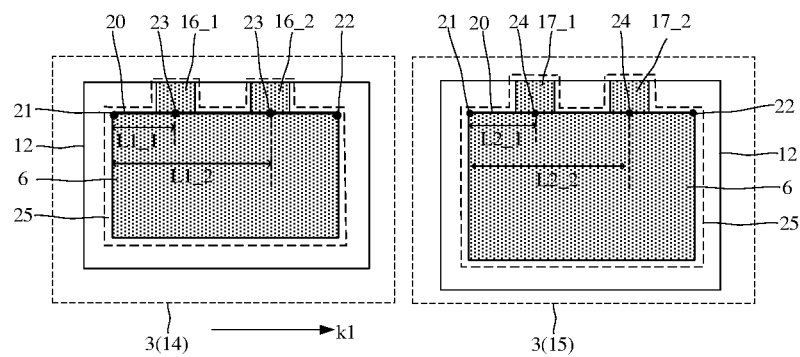
FIG. 11 is a schematic diagram of a lead-out position of the connection end according to an embodiment of the present disclosure.

In an embodiment of the present disclosure, the anode 6 has a rectangular or n-regular polygon shape, and n≥5. FIG. 11 is a schematic diagram of a lead-out position of the connection end 13 according to an embodiment of the present disclosure. Taking the anode 6 that has a rectangular shape as an example, as shown in FIG. 11, the anode 6 includes a first side 20. The first sides 20 of anodes 6 in respective sub-pixels 3 are parallel to each other. The first side 20 has a first endpoint 21 and a second endpoint 22. The directions from the first endpoint 21 to the second endpoint 22 in the respective sub-pixels 3 are the same. The expression "the directions from the first endpoint 21 to the second endpoint 22 in the respective sub-pixels 3 are the same" means that the directions from the first endpoints 21 of respective anodes 6 to the second endpoints 22 of the respective anodes 6 are parallel to each other and face toward a same direction. Referring to FIG. 11, the directions from the first endpoint 21 to the second endpoint 22 in the first sub-pixel 14 and in the second sub-pixel 15 are both the directions indicated by an arrow k1. It may be understood that, in a manufacturing process of the panel, there may be some process errors in the production of the film layer. The same direction mentioned above includes the same and substantially the same conditions within an allowable range of the process error.

The $x^{th}$ first connection end 16 protrudes from the first side 20 of the anode 6. The midpoint of the portion of the first side 20 that overlaps with the edge of the $x^{th}$ first connection end 16 is the first end lead-out point 23. There is a first distance L1 between the first end lead-out point 23 and the first endpoint 21. A ratio of the first distance L1 to the length of the first side 20 is defined as a first ratio. The $x^{th}$ second connection end 17 protrudes from the first side 20 of the anode 6. The midpoint of the portion of the first side 20 that overlaps with the edge of the $x^{th}$ second connection end 17 is the second end lead-out point 24. There is a second distance L2 between the second end lead-out point 24 and the first endpoint 21. A ratio of the second distance L2 to the length of the first side 20 is defined as a second ratio. The first ratio corresponding to the $x^{th}$ first connection end 16 is equal to the second ratio corresponding to the $x^{th}$ second connection end 17. A value of x is one or more of 1 to M.

It should be noted that FIG. 11 is a schematic diagram taking M=2 as an example. In the structure shown in FIG. 11, the values of x are 1 and 2. In FIG. 11, the $1^{st}$ first connection end 16 and the $2^{nd}$ first connection end 16 are denoted by the reference signs 16_1 and 16_2, respectively. The first distances corresponding to the $1^{st}$ first connection end 16 and the $2^{nd}$ first connection end 16 are denoted by L1_1 and L1_2, respectively. The $1^{st}$ second connection end 17 and the $2^{nd}$ second connection end 17 are denoted by reference numerals 17_1 and 17_2, respectively. The second distances corresponding to the $1^{st}$ second connection end 17 and the $2^{nd}$ second connection end 17 are denoted by L2_1 and L2_2, respectively.

As an example, a coordinate system is established along a direction where the first side 20 is located. In the first sub-pixel 14, a coordinate of the first endpoint 21 of the first side 20 is 0, a coordinate of the second endpoint 22 is 100, and coordinates of two first end lead-out points 23 corresponding to the $1^{st}$ first connection end 16 and the $2^{nd}$ first connection end 16 are 30 and 70, respectively. In the second sub-pixel 15, a coordinate of the first endpoint 21 of the first side 20 is 0, a coordinate of the second endpoint 22 is 200, and then, coordinates of two second end lead-out points 24 corresponding to the $1^{st}$ second connection end 17 and the $2^{nd}$ second connection end 17 are 60 and 140, respectively. At this time, two first connection ends 16 and two second connection ends 17 are led out from the same position of the anode 6.

With this arrangement, the $x^{th}$ first connection end 16 and the $x^{th}$ second connection end 17 not only have similar profiles, but are also led out from the same position of the anode 6. Even though the anodes 6 in the first sub-pixel 14 and the second sub-pixel 15 have different sizes, a difference between patterns of the reflective electrodes 25 in the first sub-pixel 14 and the second sub-pixel 15 may be reduced as much as possible, thereby further reducing difference of distributions of the diffraction fringes formed by reflection lights having different colors.

Figure 12:
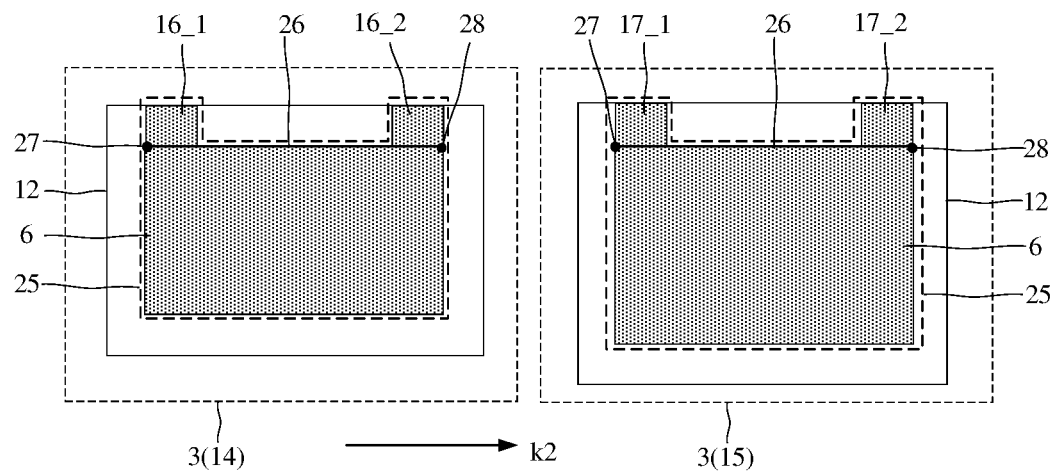
FIG. 12 is a schematic diagram of a lead-out position of the connection end according to another embodiment of the present disclosure.

In an embodiment of the present disclosure, the anode 6 has a rectangular or n-regular polygon shape, and n≥5. FIG. 12 is a schematic diagram of a lead-out position of the connection end 13 according to another embodiment of the present disclosure. Taking the anode 6 that has a rectangular shape as an example, as shown in FIG. 12, the anode 6 includes a second side 26. The second sides 26 of anodes 6 in respective sub-pixels 3 are parallel to each other. The second side 26 has a third endpoint 27 and a fourth endpoint 28. The directions from the third endpoint 27 to the fourth endpoint 28 in the respective sub-pixels 3 are the same. The expression "the directions from the third endpoint 27 to the fourth endpoint 28 in the respective sub-pixels 3 are the same" means that the directions from the third endpoint 27 of respective anode 6 to the fourth endpoint 28 of the respective anode 6 are parallel to each other and face toward same direction. Referring to FIG. 12, the directions from the third endpoint 27 to the fourth endpoint 28 in the first sub-pixel 14 and in the second sub-pixel 15 are both indicated by an arrow k2. It may be understood that, in a manufacturing process of the panel, there may be some process errors in the production of the film layer. The same direction mentioned above includes the same and substantially the same conditions within an allowable range of the process error.

The $y^{th}$ first connection end 16 protrudes from the second side 26 of the anode 6. The $y^{th}$ first connection end 16 intersects with the third endpoint 27 or the fourth endpoint 28 of the second side 26. The $y^{th}$ second connection end 17 protrudes from the second side 26 of the anode 6. The $y^{th}$ second connection end 17 intersects with the third endpoint 27 or the fourth endpoint 28 of the second side 26. The $y^{th}$ first connection end 16 and the $y^{th}$ second connection end 17 intersect with a same endpoint. A value of y is one or more of 1 to M.

FIG. 12 is a schematic diagram of taking M=2 as an example. It should be noted that, in the structure shown in FIG. 12, the values of y are 1 and 2. In FIG. 12, the $1^{st}$ first connection end 16 and the $2^{nd}$ first connection end 16 are denoted by the reference signs 16_1 and 16_2, respectively. The $1^{st}$ second connection end 17 and the $2^{nd}$ second connection end 17 are denoted by reference numerals 17_1 and 17_2, respectively.

In addition, it should be noted that the second side 26 described in this embodiment and the first side 20 described in the previous embodiment may be a same side or different sides. When the second side 26 and the first side 20 are same sides, the third endpoint 27 and the first endpoint 21 are same endpoints, and the fourth endpoint 28 and the second endpoint 22 are same endpoints also. When the second side 26 and the first side 20 are different sides adjacent to each other, the third endpoint 27 and one of the first endpoint 21 and the second endpoint 22 are same endpoints.

As an example, referring to FIG. 12 again, in the first sub-pixel 14, the $1^{st}$ first connection end 16 intersects with the third endpoint 27, and the $2^{nd}$ first connection end 16 intersects with the fourth endpoint 28. In the second sub-pixel 15, the $1^{st}$ second connection end 17 intersects with the third endpoint 27, and the $2^{nd}$ second connection end 17 intersects with the fourth endpoint 28. At this time, two first connection ends 16 and two second connection ends 17 are led out from the same position of the anode 6.

With this arrangement, the $y^{th}$ first connection end 16 and the $y^{th}$ second connection end 17 not only have similar profiles, but are also led out from the same position of the anode 6. Even though the anodes 6 in the first sub-pixel 14 and the second sub-pixel 15 have different sizes, the difference between the patterns of the reflective electrodes 25 in the first sub-pixel 14 and the second sub-pixel 15 may be reduced, thereby further reducing the difference of distributions of the diffraction fringes formed by the reflection light having different colors.

Figure 13:
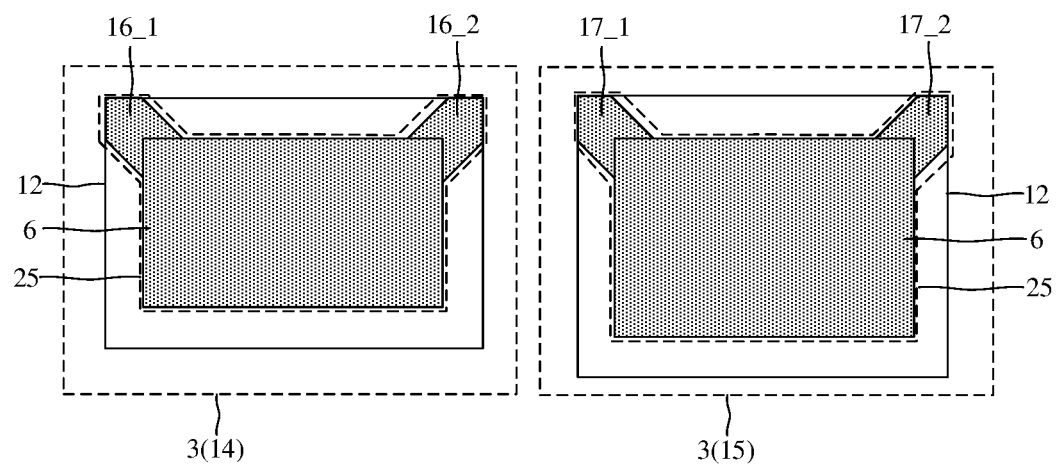
FIG. 13 is a schematic diagram of a lead-out position of the connection end according to still another embodiment of the present disclosure.

In an embodiment, the anode 6 has a rectangular or n-regular polygon shape, and n 5. Taking the anode 6 that has a rectangular shape as an example, as shown in FIG. 13. FIG. 13 is a schematic diagram of a lead-out position of the connection end 13 according to still another embodiment of the present disclosure. The $z^{th}$ first connection end 16 protrudes from the anode 6 from a top corner of the anode 6, that is, an orthographic projection of the $z^{th}$ first connection end 16 is adjacent to orthographic projections of two adjacent edges of the anode 6 in the first sub-pixel 14, respectively. The $z^{th}$ second connection end 17 protrudes from the anode 6 from the top corner of the anode 6, that is, an orthographic projection of the $z^{th}$ second connection end 17 is adjacent to orthographic projections of two adjacent edges of the anode 6 in the second sub-pixel 15, respectively. A value of z is one or more of 1 to M.

It should be noted that FIG. 13 is a schematic diagram of taking M=2 as an example. In the structure shown in FIG. 13, the values of z are 1 and 2. In FIG. 13, the $1^{st}$ first connection end 16 and the $2^{nd}$ first connection end 16 are denoted by the reference signs 16_1 and 16_2, respectively. The $1^{st}$ second connection end 17 and the $2^{nd}$ second connection end 17 are denoted by reference numerals 17_1 and 17_2, respectively.

With this arrangement, the $z^{th}$ first connection end 16 and the $z^{th}$ second connection end 17 not only have similar profiles, but are also led out from the same position of the anode 6. Even though the anodes 6 in the first sub-pixel 14 and the second sub-pixel 15 have different sizes, the difference between the patterns of the reflective electrodes 25 in the first sub-pixel 14 and the second sub-pixel 15 may be reduced, thereby further reducing the difference of distributions of the diffraction fringes formed by the reflection light having different colors.

In addition, it should be noted that the above embodiments are all taking all values of x, y, and z from 1 to M as an example. In other embodiments, when M>1, x, y, z may also adopt only part of values from 1 to M.

Figure 14:
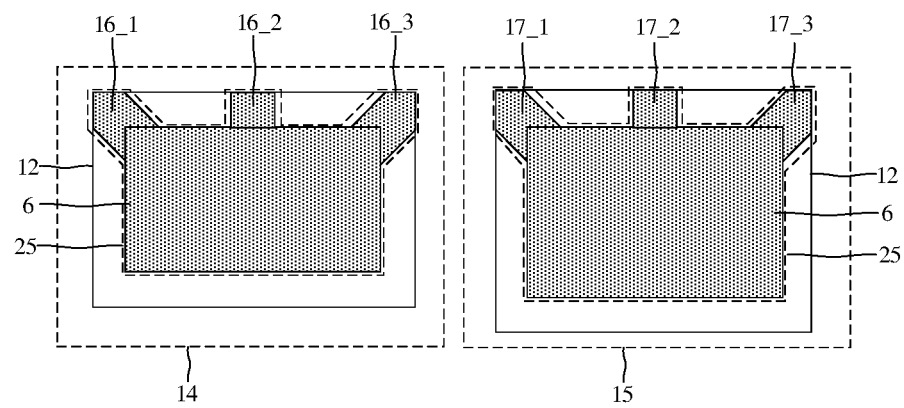
FIG. 14 is a schematic diagram of a lead-out position of the connection end according to yet another embodiment of the present disclosure.

As an example, as shown in FIG. 14, FIG. 14 is a schematic diagram of a lead-out position of the connection end 13 according to yet another embodiment of the present disclosure. When x and z adopt part of values from 1 to M, M first connection ends 16 may simultaneously include the $x^{th}$ first connection end 16 led from the first side 20 and the $z^{th}$ second connection end 17 led from the top corner of the anode 6. M second connection ends 17 may simultaneously include the $x^{th}$ second connection end 17 led from the first side 20 and the $z^{th}$ second connection end 17 led from the top corner of the anode 6. At this time, x taking M=3 shown in FIG. 14 as an example, x adopts the value 2, and z adopts the values of 1 and 3.

Figure 15:
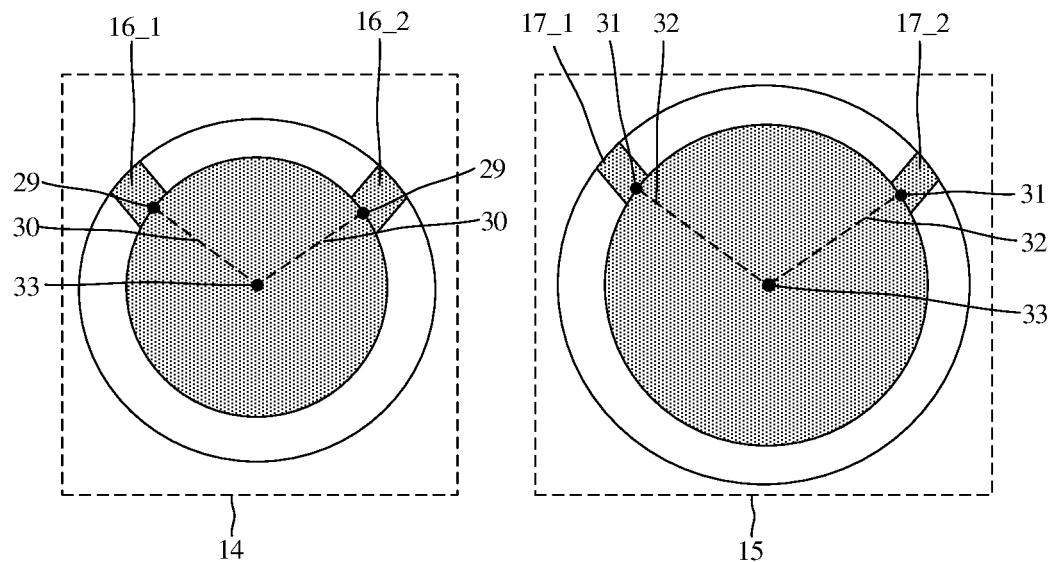
FIG. 15 is a schematic diagram of a lead-out position of the connection end according to yet still another embodiment of the present disclosure.

In an embodiment, as shown in FIG. 15, FIG. 15 is a schematic diagram of a lead-out position of the connection end 13 according to yet still another embodiment of the present disclosure. The anode 6 has a circular or oval shape. In the first sub-pixel 14, the middle point of the portion of the anode 6 that overlaps the edge of the first connection end 16 is a third end lead-out point 29. A connection line between the third end lead-out point 29 and the center point 33 of the anode 6, i.e., a connection line between intersection points of the diagonal lines or the symmetry axis of the anode 6, is a first connection line 30. In the second sub-pixel 15, the middle point of the portion of the anode 6 that overlaps the edge of the second connection end 17 is a fourth end lead-out point 31. A connection line between the fourth end lead-out point 31 and the center point 33 of the anode 6 is a second connection line 32. The first connection line 30 corresponding to the $i^{th}$ first connection end 16 is parallel to the second connection line 32 corresponding to the $i^{th}$ second connection end 17.

It should be noted that FIG. 15 is a schematic diagram of taking M=2 as an example. In FIG. 15, the $1^{st}$ first connection end 16 and the $2^{nd}$ first connection end 16 are denoted by the reference signs 16_1 and 16_2, respectively. The $1^{st}$ second connection end 17 and the $2^{nd}$ second connection end 17 are denoted by reference numerals 17_1 and 17_2, respectively.

With this arrangement, the first connection end 16 and the second connection end 17 are led out from the same position of the anode 6. Even though the anodes 6 in the first sub-pixel 14 and the second sub-pixel 15 have different sizes, the difference between the patterns of the reflective electrodes 25 in the first sub-pixel 14 and the second sub-pixel 15 may be reduced, thereby further reducing the difference of distributions of the diffraction fringes formed by the reflection light having different colors.

Figure 16:
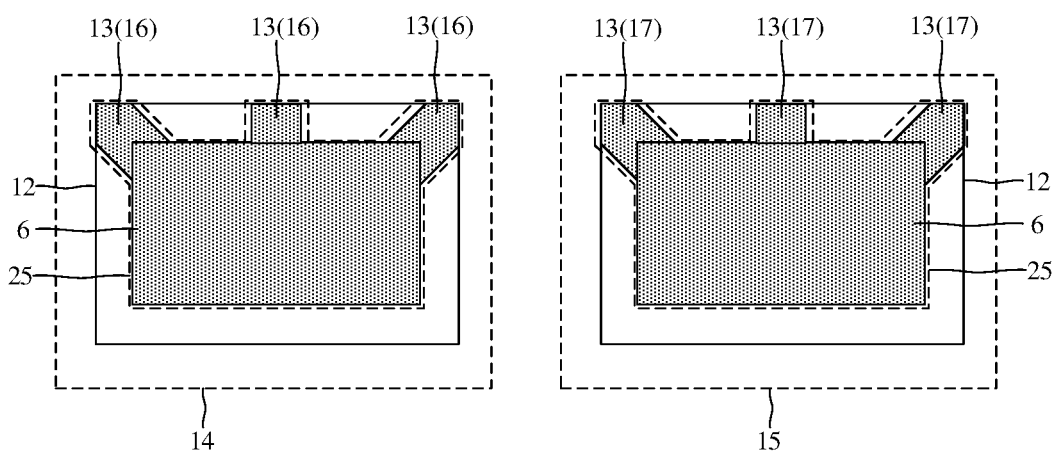
FIG. 16 is a structural schematic diagram of anodes in a first sub-pixel and a second sub-pixel according to an embodiment of the present disclosure.

In an embodiment, as shown in FIG. 16, FIG. 16 is a structural schematic diagram of the anode 6 in the first sub-pixel 14 and the second sub-pixel 15 according to an embodiment of the present disclosure. The pattern of the anode 6 in the first sub-pixel 14 after being translated overlaps with the pattern of the anode 6 in the second sub-pixel 15, that is, the anodes 6 in the first sub-pixel 14 and the second sub-pixel 15 have the same shape and the same area.

Compared with the connection end 13, the anode 6 has a larger area, therefore the pattern of the anode 6 has a smaller influence on distribution of the diffraction fringes generated by the reflection light. In an embodiment, by setting the patterns of the anodes in the first sub-pixel 14 and the second sub-pixel 15 be the same, the difference in the patterns of the reflective electrode 25 in the first sub-pixel 14 and the second sub-pixel 15 is reduced to a greater extent, therefore distribution of diffraction fringes formed by the reflection light having different colors tends to be more uniform.

Further, under the premise that patterns of the anode 6 in the first sub-pixel 14 and the second sub-pixel 15 are the same, in order to further ensure a uniform distribution of the diffraction fringes formed by the reflection light having different colors, and in order to improve the color separation phenomenon of the overall diffraction image of the panel to a greater extent, referring to FIG. 16 again, the anode 6 and M connection ends 13 connected to the anode 6 constitute the reflective electrode 25, and the patterns of the reflective electrode 25 in the first sub-pixel 14 and the second sub-pixel 15 after being translated are overlapped. In other words, the overall pattern composed of M connection ends 13 in the first sub-pixel 14 after being translated overlaps with the overall pattern composed of M connection ends 13 in the second sub-pixel 15.

In another embodiment of the present disclosure, since characteristics of the light-emitting materials of the light-emitting layers in the sub-pixels having different colors are different, there may be a difference in service life attenuation between the first sub-pixel 14 and the second sub-pixel 15. For example, when the first sub-pixel 14 is a red sub-pixel and the second sub-pixel 15 is a blue sub-pixel, compared to the first sub-pixel 14, the service life attenuation of the second sub-pixel 15 is faster. For this reason, the area of the anode 6 of the second sub-pixel 15 is set to be larger to reduce the current density flowing through the light-emitting element, thereby further slowing down the speed of service life attenuation of the second sub-pixel 15.

Figure 17:
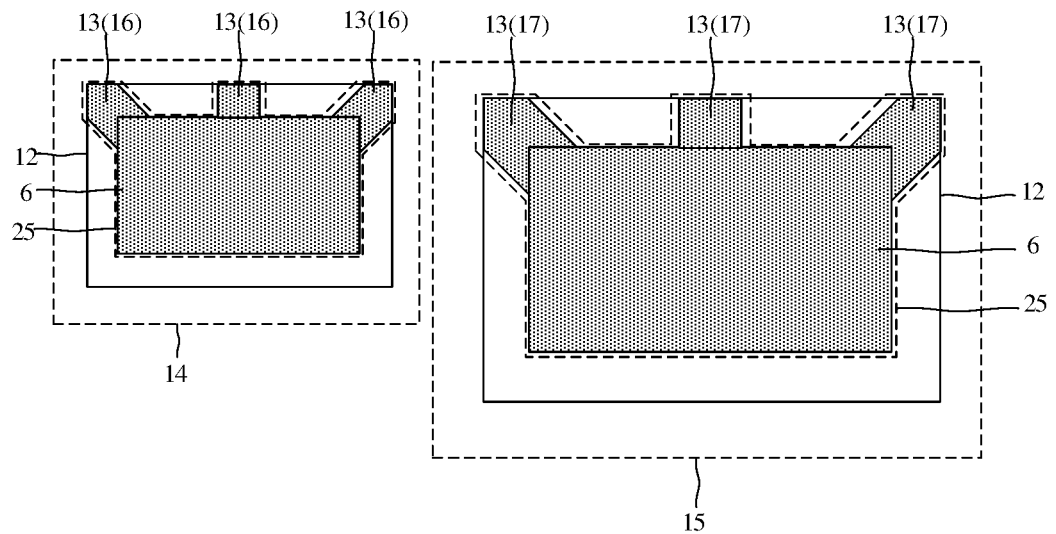
FIG. 17 is a structural schematic diagram of anodes in a first sub-pixel and a second sub-pixel according to another embodiment of the present disclosure.

Based on this, as shown in FIG. 17, FIG. 17 is structural schematic diagram of anodes 6 in the first sub-pixel 14 and the second sub-pixel 15 according to another embodiment of the present disclosure. The pattern of the anode 6 in the first sub-pixel 14, after being scaled up or scaled down and translated, overlaps with the pattern of the anode 6 in the second sub-pixel 15 so that the difference in the size of the anode 6 is used to compensate for the difference in the service life attenuation between the first sub-pixel 14 and the second sub-pixel 15. Moreover, under the premise that the anode 6 in the first sub-pixel 14 and the second sub-pixel 15 are having different sizes, by setting the shape of the anodes 6 in the first sub-pixel 14 and the second sub-pixel 15 to be the same, the influence of patterns of the anode 6 on the distribution of diffraction fringes formed by reflection light having different colors.

Further, in order to further reduce difference in the patterns of the reflective electrode 25 in the first sub-pixel 14 and the second sub-pixel 15, the anode 6 and M connection ends 13 connected to the anode 6 constitute the reflective electrode 25, and the pattern of the reflective electrode 25 in the first sub-pixel 14, after being scaled up, scaled down and translated, overlaps with the pattern of the reflective electrode 25 in the second sub-pixel 15. In other words, the overall pattern composed of M connection ends 13 in the first sub-pixel 14, after being scaled up, scaled down and translated, overlaps with the overall pattern composed of M connection ends 13 in the second sub-pixel 15.

Figure 18:
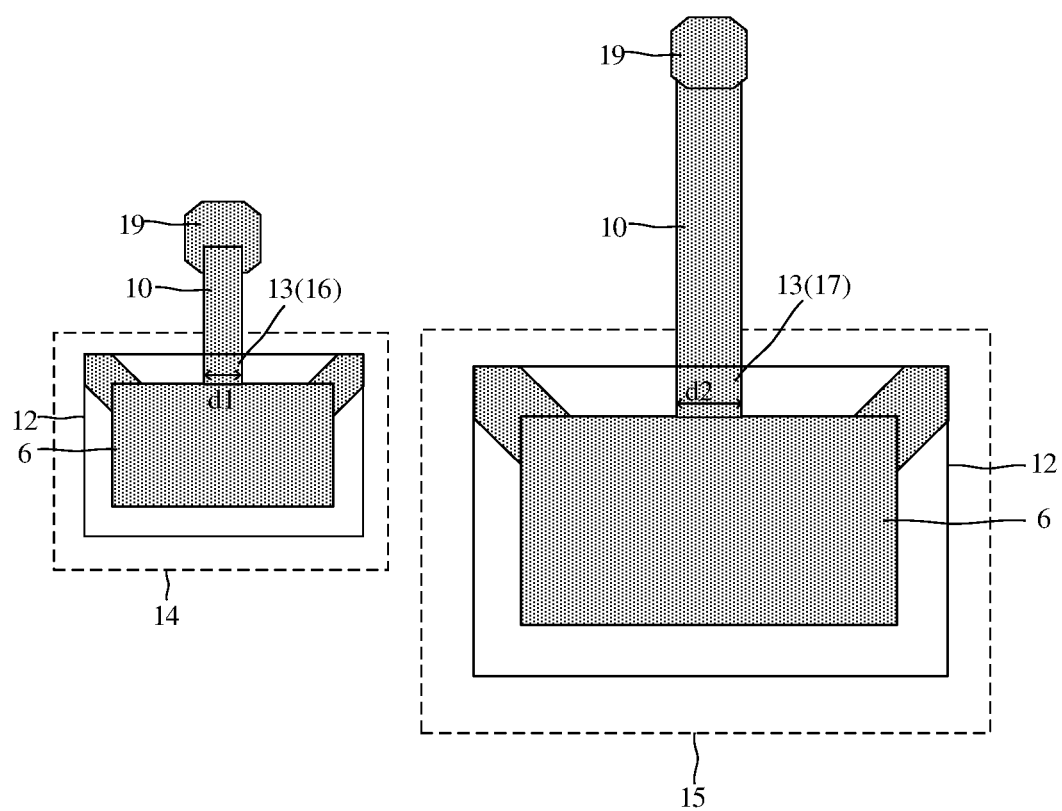
FIG. 18 is a schematic diagram of setting positions of through holes in the first sub-pixel and the second sub-pixel according to an embodiment of the present disclosure.

Further, in combination with FIG. 6, the array layer 2 further includes a planarization layer 18 located between the pixel drive circuit 4 and the light-emitting element 5. The planarization layer 18 is provided with a through hole 19 through which the connection trace 10 is electrically connected to the pixel drive circuit 4. As shown in FIG. 18, FIG. 18 is a schematic diagram showing the setting positions of through holes 19 in the first sub-pixel 14 and the second sub-pixel 15 according to an embodiment of the present disclosure, when the pattern of the reflective electrode 25 in the first sub-pixel 14, after being scaled up or scaled down and then translated, overlaps with the pattern of the reflective electrode 25 in the second sub-pixel 15, a line width d1 of the first connection end 16 is smaller than a line width d2 of the second connection end 17. At this time, a distance between the first connection end 16 and the through hole 19 corresponding to the first connection end 16 is set to be smaller than a distance between the second connection end 17 and the through hole 19 corresponding to the second connection end 17, so that a length of the connection trace 10 connected to the first connection end 16 is smaller than the length of the connection trace 10 connected to the second connection end 17. The load difference of the connection end 10 is used to compensate the load difference between the first connection end 16 and the second connection end 17, so that overall load of the connection end 16 and the connection trace 10 connected to the first connection end 16 tends to be equal to the overall load of the second connection end 17 and the connection trace 10 connected to the second connection end 17.

It should be noted that, in an embodiment of the present disclosure, the connection trace 10 may extend in a straight line as shown in FIG. 18, or may extend in a non-straight line as shown in FIG. 7 and FIG. 8. The trace load of the connection trace 10 may be further adjusted by further adjust the extension mode of the connection trace 10, so that the overall load of the connection end 16 and the connection trace 10 connected to the connection 16 tends to better coincide with the overall load of the second connection end 17 and the connection trace 10 connected to the second connection end 17.

Figure 19:
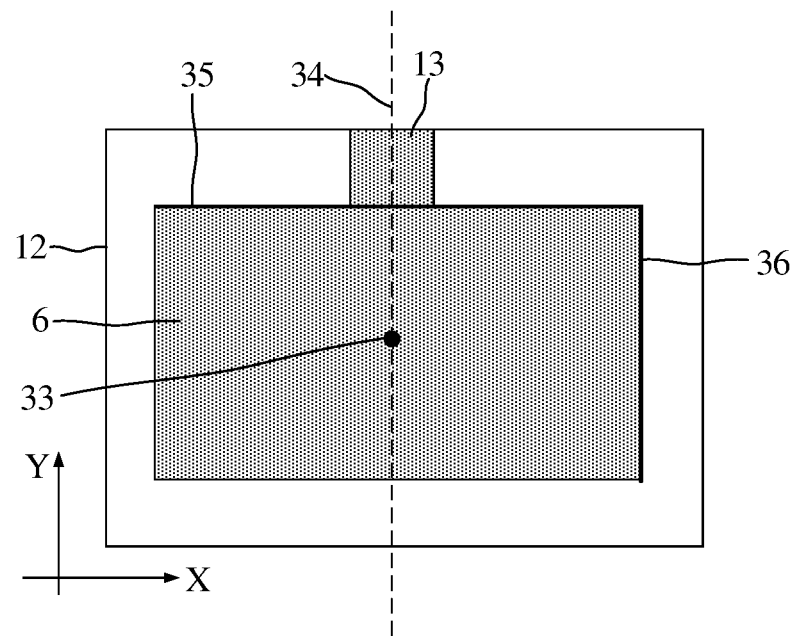
FIG. 19 is a structural schematic diagram of a connection end according to an embodiment of the present disclosure.
Figure 20:
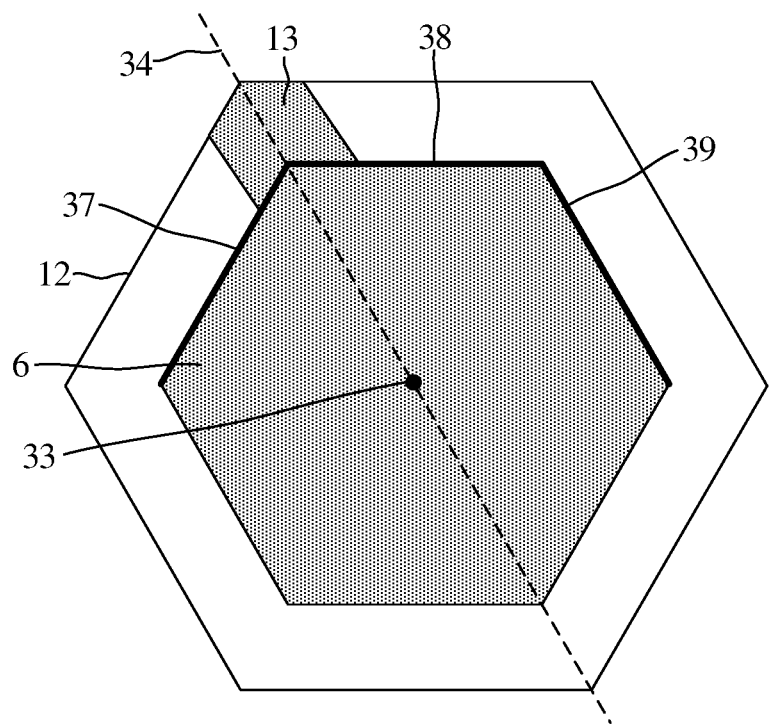
FIG. 20 is a structural schematic diagram of a connection end according to another embodiment of the present disclosure.

FIG. 19 is a structural schematic diagram of a connection end 13 according to an embodiment of the present disclosure, and FIG. 20 is a structural schematic diagram of a connection end 13 according to another embodiment of the present disclosure. In an embodiment of the present disclosure, as shown in FIG. 19 and FIG. 20, there is at least one edge parallel to the edge of the anode 6 in the connection end 13.

It may be understood that the area of the anode 6 is larger than that of the connection end 13. Therefore, the diffraction image formed by the reflective electrode 25 is mainly determined by the distribution of diffraction fringes generated by the light reflected by the anode 6. In an embodiment, by adjusting the setting position of the connection end 13 to make the edge of the connection end be parallel to the edge of the anode 6, it is possible to avoid extra diffraction fringes generated due to the connection end 13, thereby avoiding influence on the distribution of diffraction fringes generated by the reflective electrode 25 as a whole.

Further, referring to FIG. 19 and FIG. 20 again, in order to further reduce the influence on the distribution of the diffraction fringes, the respective edges of the connection end 13 may each be parallel to one of the edges of the anode 6.

In an embodiment of the present disclosure, referring to FIG. 19 and FIG. 20 again, the connection end 13 is symmetrical along a first symmetry axis 34, and the first symmetry axis 34 passes through the center point 33 of the anode 6.

At this time, the connection end 13 is led out from the middle position of the anode 6, the diffraction fringes generated by the reflection light reflected by the connection end 13 have a higher overlapping degree with the diffraction fringes generated by the reflection light reflected by the anode 6. A range of the diffraction image generated by the refractive electrode 25 is still determined by the distribution of the diffraction fringes generated by the anode 6, and the connection end 13 may not affect the generation range of the diffraction image.

It should be noted that, referring to FIG. 19 and FIG. 20 again, the connection end 13 may not only satisfy that its edge is parallel to the edge of the anode 6, but also satisfies that the connection end 13 is symmetrical along the first symmetry axis 34. At this time, the influence of connection end 13 on the distribution of diffraction fringes is minimized, thereby avoiding the influence on the generation range of the diffraction image to a greater extent.

Further, referring to FIG. 19 again, the anode 6 has a rectangular shape. The anode 6 includes a first edge 35 extending in a first direction X and a second edge 36 extending in a second direction Y. The connection end 13 protrudes from the first edge 35 of the anode 6. The connection end 13 has a rectangular shape. The connection end 13 is symmetrical along the first symmetry axis 34. The first symmetry axis 34 is parallel to the second direction Y. The first direction X intersects with the second direction Y.

With this arrangement, the respective edges of the connection end 13 are each parallel to one of edges the anode 6. Meanwhile, the connection end 13 is also symmetrical along the first symmetry axis 34, so that the connection end 13 may not generate extra diffraction fringes, thereby ensuring a higher overlapping degree between the diffraction fringes generated by the connection end 13 and the anode 6.

Alternatively, referring to FIG. 20 again, the anode 6 is a regular hexagon shape. The anode 6 includes a third edge 37, a fourth edge 38 and a fifth edge 39 that are sequentially connected. The connection end 13 protrudes from the anode 6 in a top corner defined by the third edge 37 and the fourth edge 38 of the anode 6. The edge of the connection end 13 that intersects with the third edge 37 and the fourth edge 38 is parallel to the fifth edge 39. The connection end 13 is symmetrical along the first symmetry axis 34. The first symmetry axis 34 is parallel to the fifth edge 39.

With this arrangement, the respective edges of the connection end 13 are each parallel to one of edges of the anode 6. Meanwhile, the connection end 13 is also symmetrical along the first symmetry axis 34, so that the connection end 13 may not generate extra diffraction fringes, thereby ensuring a higher overlapping degree between the diffraction fringes generated by the connection end 13 and the anode 6.

Figure 21:
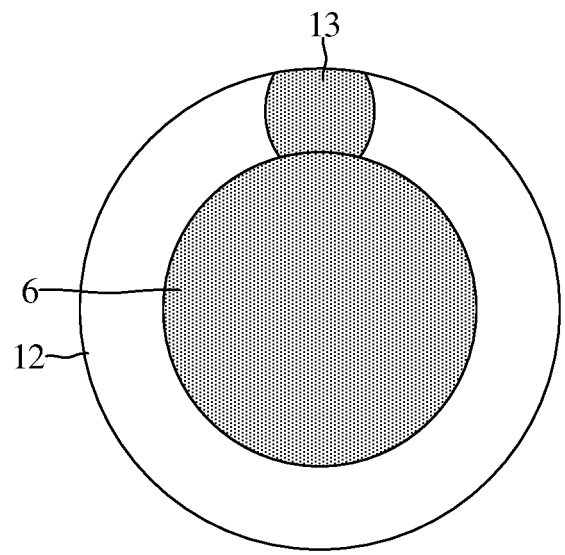
FIG. 21 is a structural schematic diagram of a connection end according to still another embodiment of the present disclosure.

FIG. 21 is a structural schematic diagram of a connection end 13 according to still another embodiment of the present disclosure. In an embodiment, as shown in FIG. 21, the anode 6 is in a circular or elliptical shape, and an edge of the connection end 13 is in an arc shape, so that the extension direction of the edge of the connection end 13 is as close as possible to the extension direction of a certain section of the edge of the anode 6 to avoid extra diffraction fringes generated on the connection end 13.

In one embodiment, referring to FIG. 7 again, M=1. Based on this arrangement, each anode 6 only leads out one trace lead-out end 9 to be electrically connected to the connection trace 10, so that the area of the reflective electrode 25 exposed in the opening 12 is small, thereby reducing the reflection of the ambient light by the reflective electrode 25, and weakening the diffraction phenomenon caused by the ambient light.

Further, referring to FIG. 6 and FIG. 7 again, the array layer 2 also includes a planarization layer 18 located between the pixel drive circuit 4 and the light-emitting element 5. The planarization layer 18 is provided with a through hole 19 through which the connection trace 10 is electrically connected to the pixel drive circuit 4. The opposite sides of the anode 6 in the second direction Y are defined as a first side and a second side, respectively. In the direction perpendicular to the plane of the substrate 1, orthographic projections of the connection end 13 and the through hole 19 are located at the first side of the orthographic projection on the anode 6. At this time, the setting positions of the connection end 13 and the through hole 19 are arranged at the same side of the anode 6, the length of the connection trace 10 connected between the connection end 13 and the through hole 19 is relatively short, and the load is small, thereby reducing signal attenuation.

In an embodiment, the display panel includes sub-pixels 3 with N types having different light-emitting colors, N>1, M=N, e.g., M=N=3. Since the relative positions of the anode 6 and the corresponding through hole in the sub-pixels 3 having different colors are different, in an embodiment, by setting M=N, a suitable connection end 13 may be selected among M trace lead-out ends 9 to be connected to the connection trace 10, so that the setting position and extension length of the connection trace 10 may be designed more flexibly.

Figure 22:
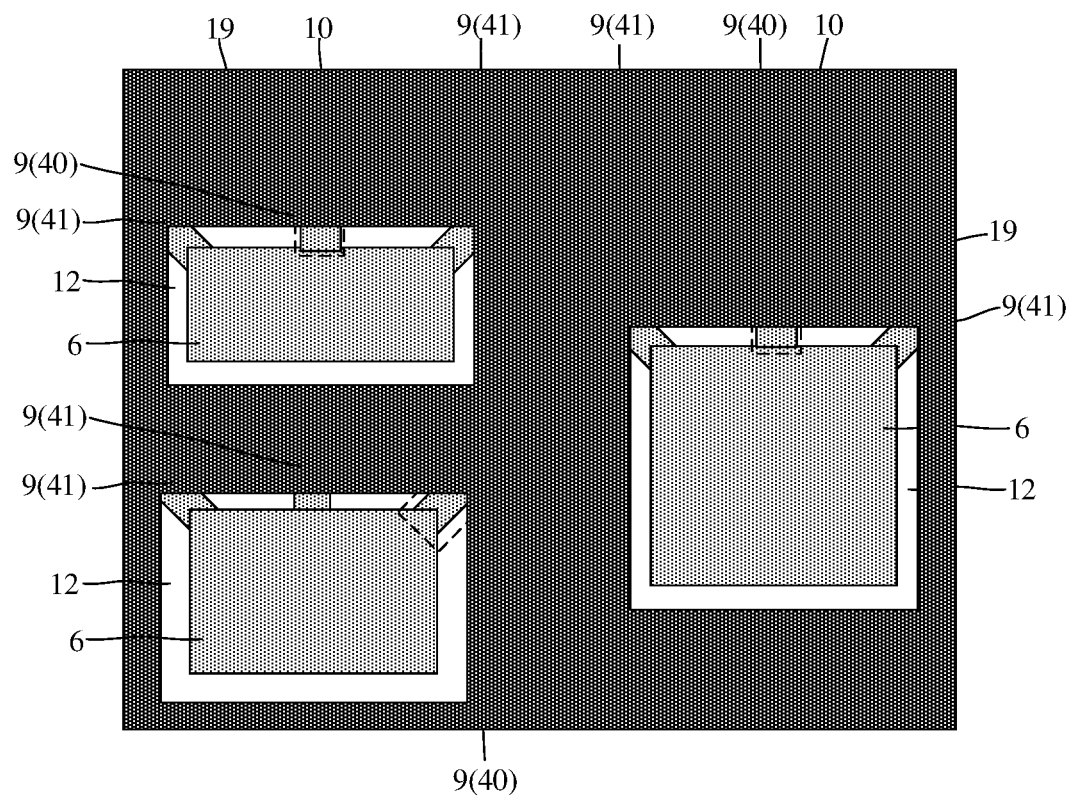
FIG. 22 is a schematic diagram showing connection of a trace lead-out end according to an embodiment of the present disclosure.

Further, in conjunction with FIG. 6, as shown in FIG. 22, FIG. 22 is a schematic diagram showing connection of a trace lead-out end 9 according to an embodiment of the present disclosure. M trace lead-out ends 9 include one first lead-out end 40 and M−1 second lead-out ends 41, and only the first lead-out end 40 is electrically connected to the connection trace 10. The array layer 2 also includes a planarization layer 18 located between the pixel drive circuit 4 and the light-emitting element 5. The planarization layer 18 is provided with a through hole 19 through which the connection trace 10 is electrically connected to the pixel drive circuit 4. The lead-out end 40 is a lead-out end 9 of the M lead-out ends 9 that is closest to the through hole 19, so that the length of the connecting lead 10 between the first lead-out 40 and the through hole 19 is reduced, and the trace load is reduced, thereby reducing signal attenuation.

Figure 23:
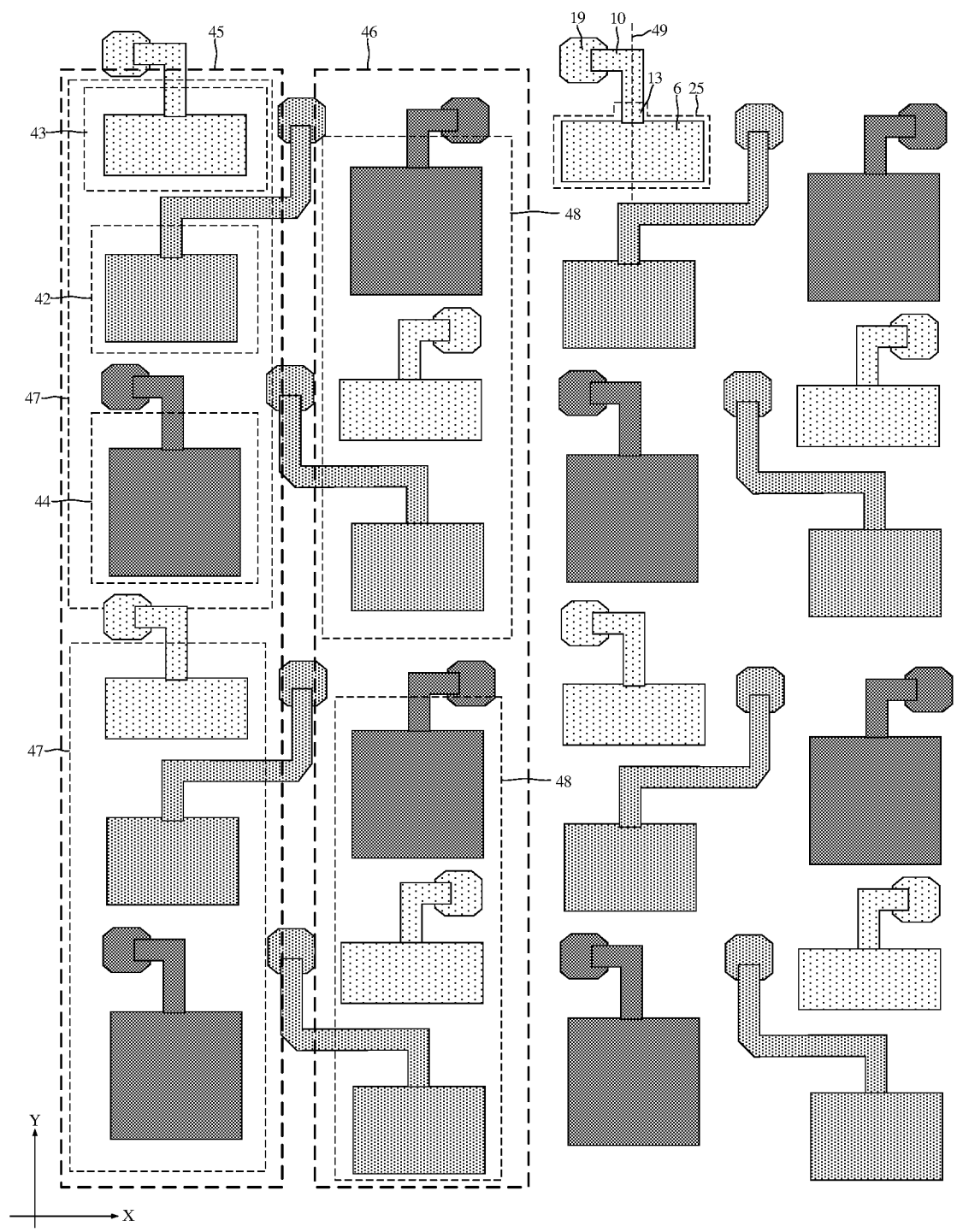
FIG. 23 is a schematic diagram showing arrangement of sub-pixels according to an embodiment of the present disclosure.
Figure 24:
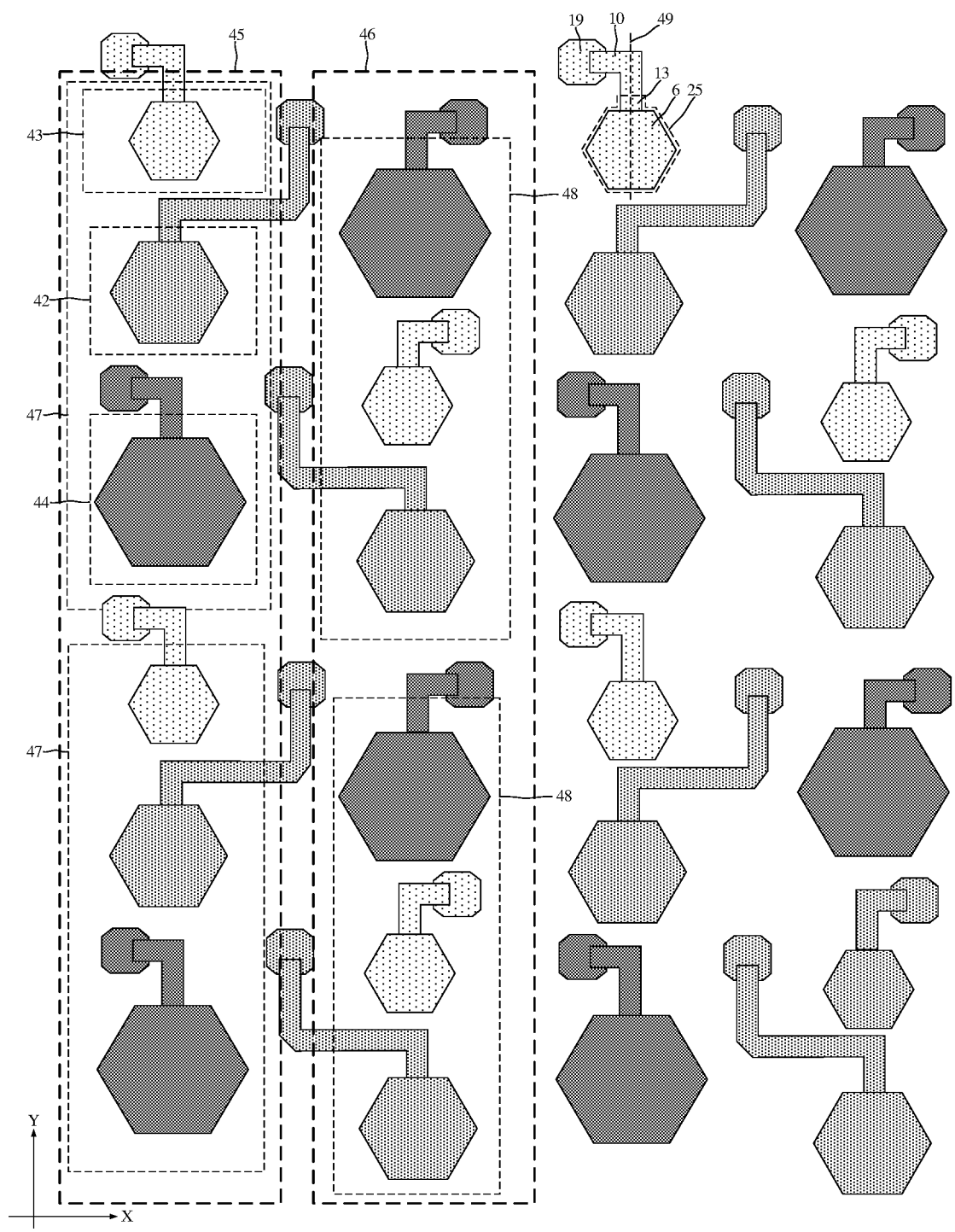
FIG. 24 is a schematic diagram showing arrangement of sub-pixels according to another embodiment of the present disclosure.
Figure 25:
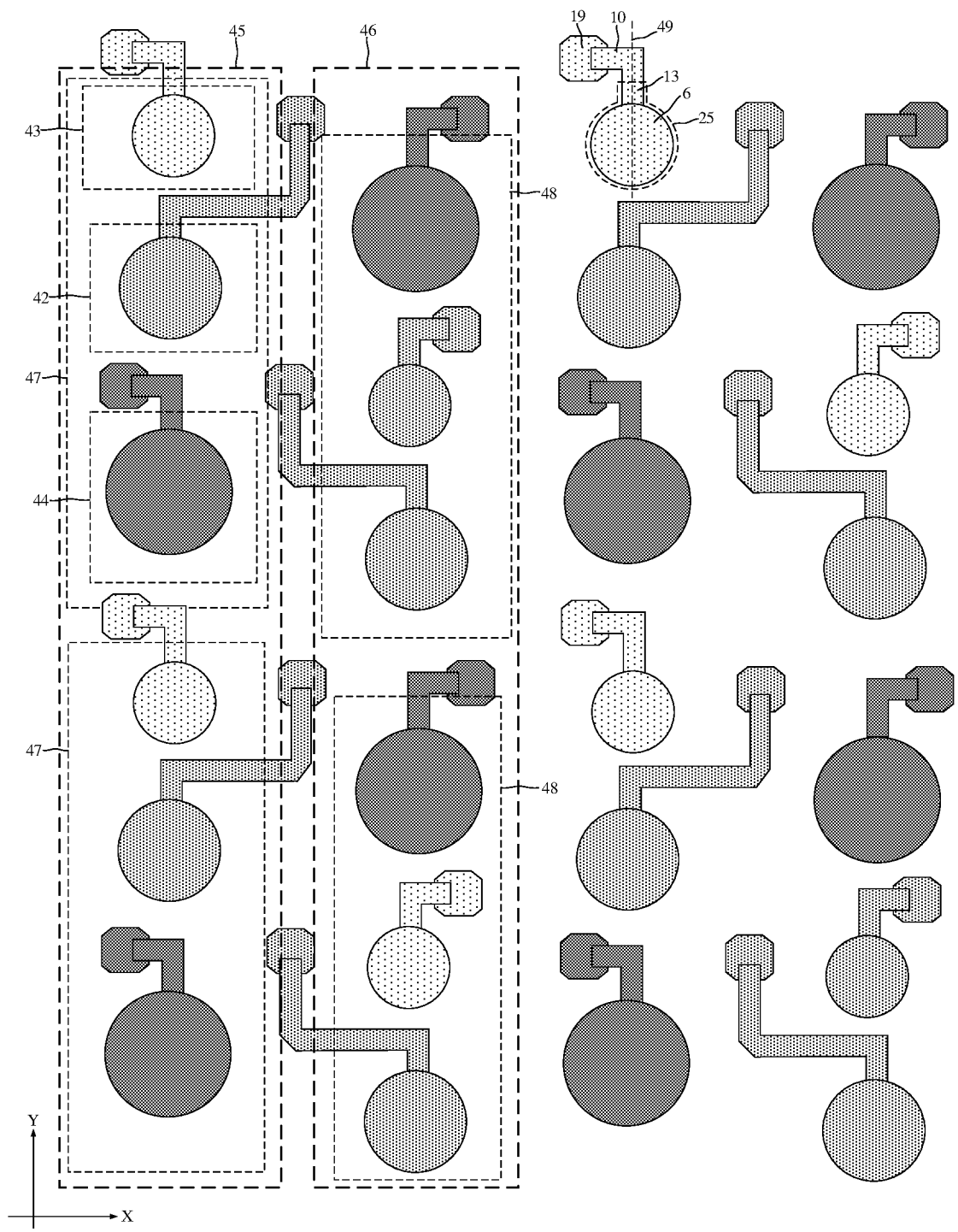
FIG. 25 is a schematic diagram showing arrangement of sub-pixels according to still another embodiment of the present disclosure.

FIG. 23 is a schematic diagram of arrangement of sub-pixels 3 according to an embodiment of the present disclosure, FIG. 24 is a schematic diagram of arrangement of sub-pixels 3 according to another embodiment of the present disclosure, and FIG. 25 is a schematic diagram of arrangement of sub-pixels 3 according to still another embodiment of the present disclosure. In an embodiment, as shown in FIG. 23 to FIG. 25, the sub-pixels 3 include first color sub-pixels 43, second color sub-pixels 42 and third color sub-pixels 44 that have different colors from one another. The first sub-pixel 14 and the second sub-pixel 15 are any two of the first color sub-pixel 43, the second color sub-pixel 42, and the third color sub-pixel 44. The first color, the second color and the third color may be red, green and blue.

The display panel includes a first sub-pixel column 45 and a second sub-pixel column 46 that are alternately arranged in a first direction X. The first sub-pixel columns 45 include a plurality of first pixel units 47 arranged along a second direction Y. The first pixel unit 47 includes a first color sub-pixel 43, a second color sub-pixel 42, and a third color sub-pixel 44 that are arranged along a second direction Y. The second sub-pixel column 46 includes a plurality of second color sub-pixels 48 arranged along the second direction Y. The second pixel unit 48 includes a third color sub-pixel 44, a first color sub-pixel 43, and a second color sub-pixel 42 that are arranged along the second direction Y. The $k^{th}$ sub-pixels 3 in the first sub-pixel column 45 and the second sub-pixel column 46 are staggeringly arranged in the first direction X. The second direction Y intersects with the first direction X, and k≥1.

The anodes 6 in the first color sub-pixel 43, the second color sub-pixel 42 and the third color sub-pixel 44 are electrically connected to a connection end 13. The anode 6 and the connection end 13 connected to the anode 6 constitute a reflective electrode 25. The reflective electrode 25 is symmetrical along the second symmetry axis 49. The second symmetry axis 49 is parallel to the second direction Y.

Figure 26:
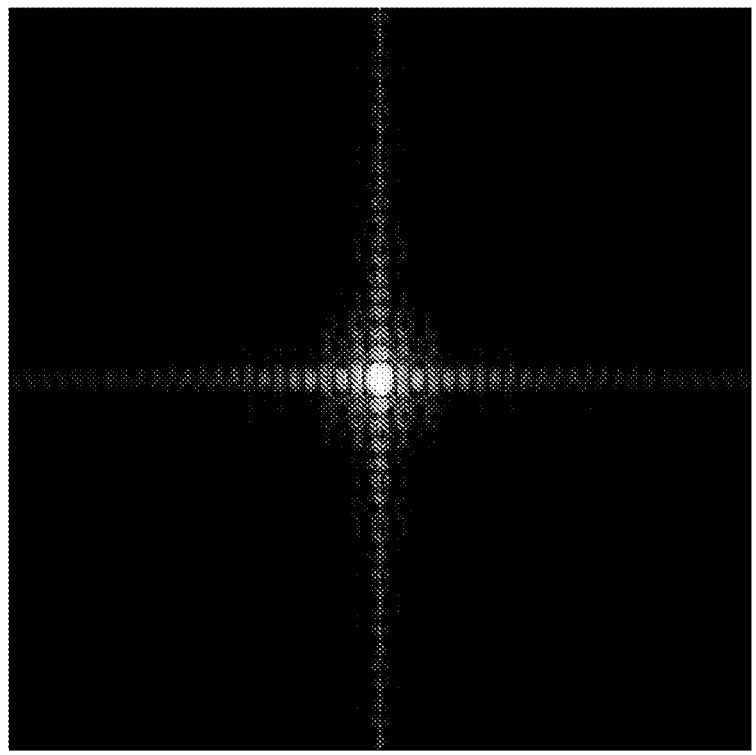
FIG. 26 is a schematic diagram showing a diffraction image corresponding to FIG. 23.
Figure 27:
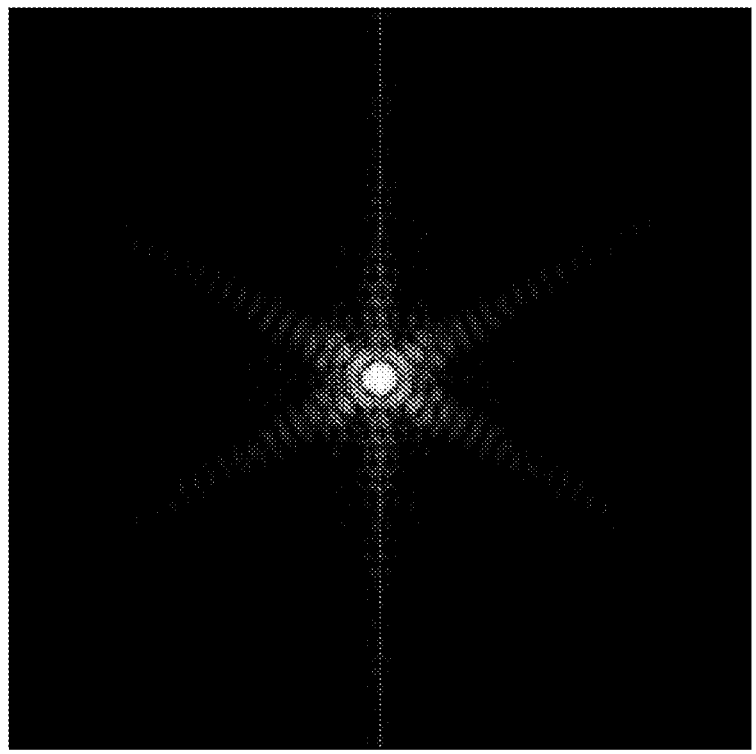
FIG. 27 is a schematic diagram showing a diffraction image corresponding to FIG. 24.
Figure 28:
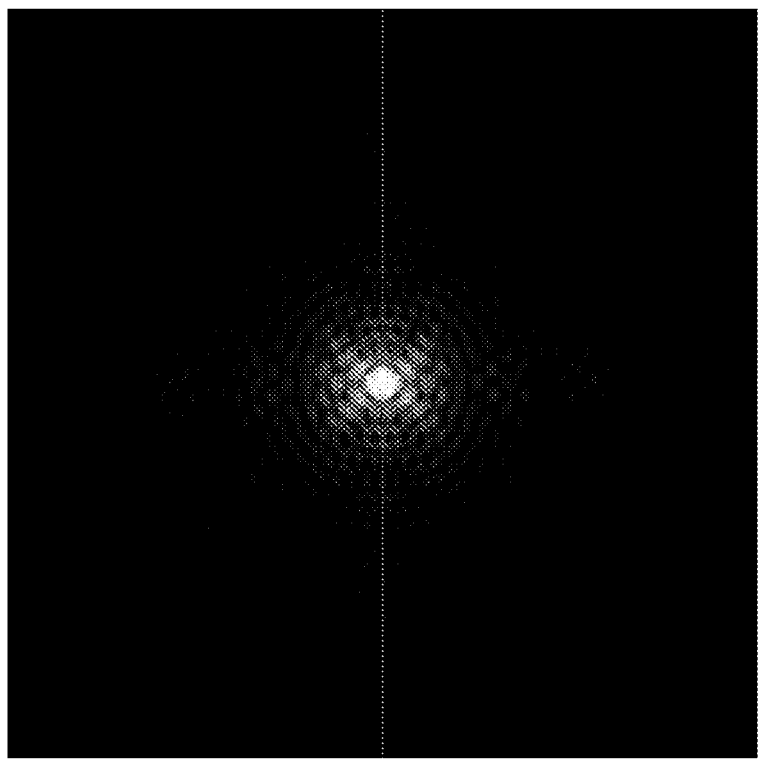
FIG. 28 is a schematic diagram showing a diffraction image corresponding to FIG. 25.

It should be noted that the shape of the anodes 6 in the first color sub-pixel 43, the second color sub-pixel 42, and the third color sub-pixel 44 may form a rectangle as shown in FIG. 23. At this time, the diffraction image formed by the panel is as shown in FIG. 26. Alternatively, the shape of the anodes 6 in the first color sub-pixel 43, the second color sub-pixel 42, and the third color sub-pixel 44 may form a regular hexagon as shown in FIG. 24. At this time, the diffraction image formed by the panel is as shown in FIG. 27. Alternatively, the shape of the anodes 6 in the first color sub-pixel 43, the second color sub-pixel 42 and the third color sub-pixel 44 may form a circle as shown in FIG. 25. At this time, the diffraction image formed by the panel is as shown in FIG. 28.

In the above arrangement, on the one hand, each anode 6 only leads out one trace lead-out end 9 to be electrically connected to the connection trace 10, so that the area of the reflective electrode 25 exposed in the opening 12 is small, thereby reducing reflection of the ambient light by the reflective electrode 25, and weakening the diffraction phenomenon of the ambient light. On the other hand, the reflective electrode 25 is symmetrical along the second symmetry axis 49, that is, the connection end 13 is led out from the middle position of the anode 6. The diffraction fringes generated by the reflection light reflected by the connection end 13 has a higher overlapping degree with the diffraction fringes generated by the reflection light reflected by the anode 6. A range of the diffraction image generated by the refractive electrode 25 is still determined by the distribution of the diffraction fringes generated by the anode 6, and the connection end 13 may not affect the generation range of the diffraction image.

Further, in order to optimize the layout design, in the first sub-pixel column 45 and the second sub-pixel column 46 adjacent to each other, the through holes 19 corresponding to the nearest second color sub-pixel 42 and the third color sub-pixel 44 are arranged by aligning in the first direction X.

Figure 29:
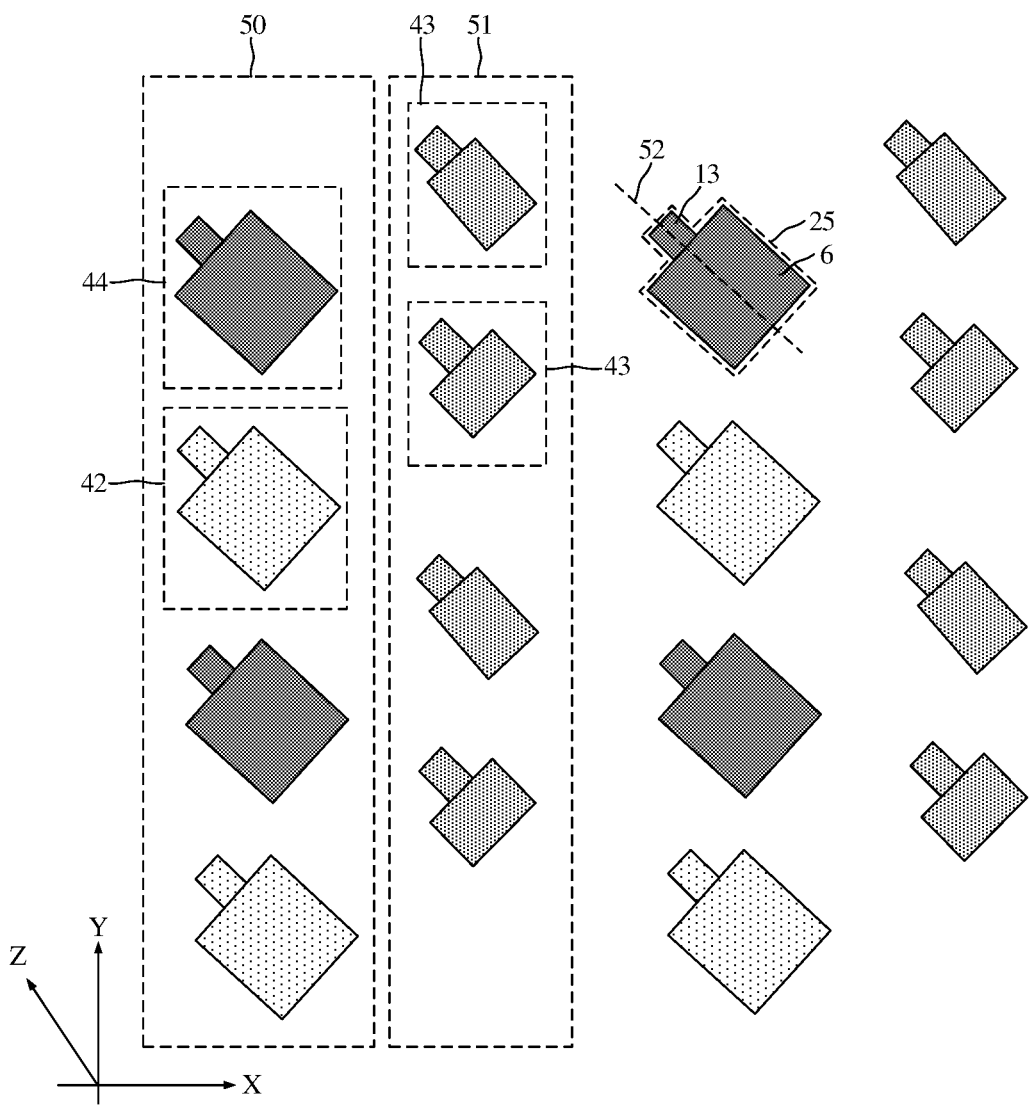
FIG. 29 is a schematic diagram showing an arrangement of sub-pixels according to another embodiment of the present disclosure.

In an embodiment, as shown in FIG. 29, FIG. 29 is a schematic diagram showing an arrangement of sub-pixels 3 according to another embodiment of the present disclosure. The sub-pixel 3 include a first color sub-pixel 43, a second color sub-pixel 42 and the third color sub-pixel 44 that have different light-emitting colors from each other. The first sub-pixel 14 and the second sub-pixel 15 are any two of the first color sub-pixel 43, the second color sub-pixel 42, and the third color sub-pixel 44. The first color, the second color and the third color may be red, green and blue.

The display panel includes a third sub-pixel column 50 and a fourth sub-pixel column 51 that are alternately arranged in the first direction X. In the third sub-pixel column 50, the third color sub-pixel 44 and the first color sub-pixel 43 are arranged in the first direction X. The fourth sub-pixel column 51 includes a plurality of second color sub-pixels 42 arranged in the second direction Y. In two adjacent second color sub-pixels 42, the pattern of the anode 6 in the previous color sub-pixel 42 that is rotated 90° clockwise and then translated overlaps with the pattern of the anode 6 in the latter second color sub-pixel 42. The $k^{th}$ sub-pixels 3 in the third sub-pixel column 50 and the fourth sub-pixel column 51 are staggeringly arranged in the first direction X. The second direction Y intersects with the first direction X, and k≥1.

The anodes 6 in the first color sub-pixel 43, the second color sub-pixel 42 and the third color sub-pixel 44 are electrically connected to a connection end 13. The anode 6 and the connection end 13 connected to the anode 6 constitute a reflective electrode 25. The reflective electrode 25 is symmetrical along the third symmetry axis 52. The third symmetry axis 52 is parallel to the third direction Z. The third direction Z intersects with the first direction X and the second direction Y, respectively.

In the above arrangement, on the one hand, each anode 6 only leads out one trace lead-out end 9 to be electrically connected to the connection trace 10, so that the area of the reflective electrode 25 exposed in the opening 12 is small, thereby reducing reflection of the ambient light by the reflective electrode 25, and weakening the diffraction of the ambient light. On the other hand, the reflective electrode 25 is symmetrical along the third symmetry axis 52, that is, the connection end 13 is led out from the middle position of the anode 6. The diffraction fringes generated by the reflection light reflected by the connection end 13 has a higher overlapping degree with the diffraction fringes generated by the reflection light reflected by the anode 6. A range of the diffraction image generated by the refractive electrode 25 is still determined by the distribution of the diffraction fringes generated by the anode 6, and the connection end 13 may not affect the generation range of the diffraction image.

Figure 30:
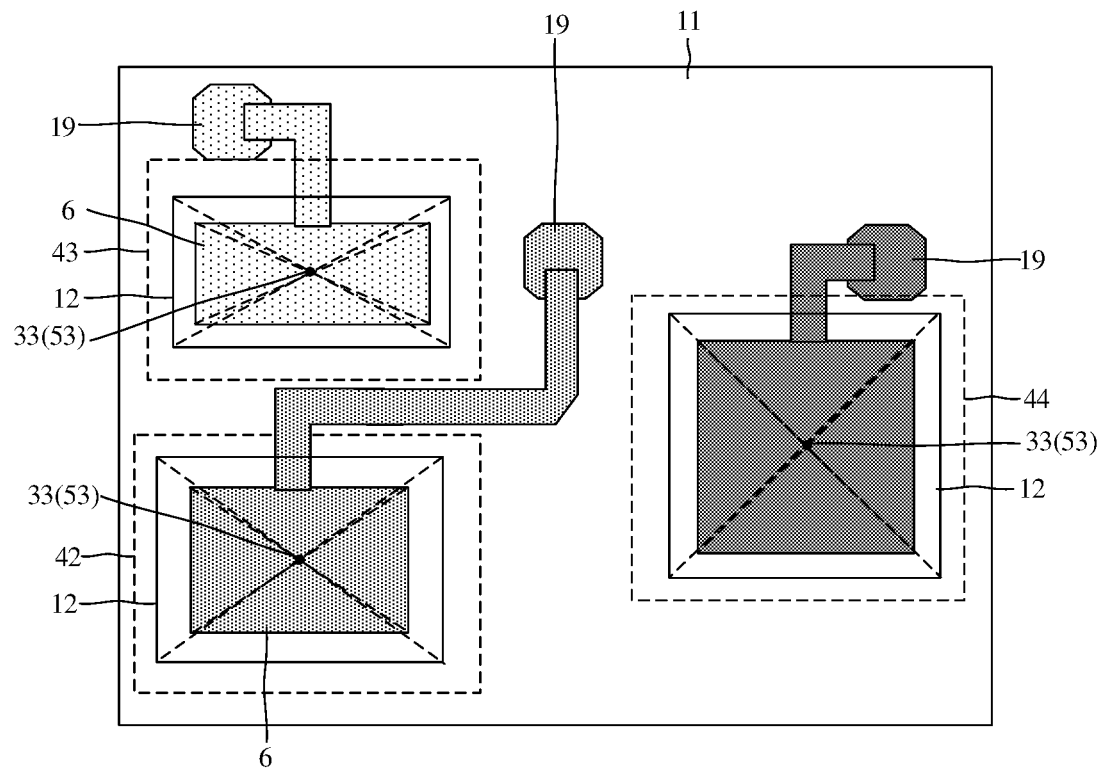
FIG. 30 is a structural schematic diagram showing an opening according to an embodiment of the present disclosure.

FIG. 30 is a structural schematic diagram showing an opening 12 according to an embodiment of the present disclosure. In an embodiment, taking a display panel that includes a first color sub-pixel 43, a second color sub-pixel 42, and a third color sub-pixel 44 as an example. As shown in FIG. 30, the center point 53 of the opening 12 overlaps with the center point 33 of the anode 6 located in the opening 12. The center point 53 of the opening 12 is an intersection point between the diagonal lines or symmetry axes of the opening 12. The center point 33 of the anode 6 is an intersection point between the diagonal lines or the symmetry axes of the anode 6. In this way, the sidewalls used to form the opening 12 in the black matrix 11 have the same effect on the light having different angles emitted through different positions of the opening 12, such as display light or ambient reflection light, so that it improves uniformity of light emission, and makes brightness of the diffraction fringes formed by the reflection light be uniformly distributed, thereby avoiding aggravation of color separation phenomenon of the diffraction image.

Further, in order to improve uniformity of light emission and reduce color separation phenomenon of the diffraction image to a greater extent, referring to FIG. 30 and FIG. 31 again, the opening 12 and the anode 6 located in the opening 12 have similar profiles, that is, the opening 12 and the anode 6 located in the opening 12 have a same shape, but the area of the opening 12 is larger.

Further, referring to FIG. 30 and FIG. 31 again, the distances between the edge of the opening 12 and the edge of the anode 6 closest to the opening are the same. After the ambient light enters the anode 6 and is reflected by the anode 6, the sidewalls of the black matrix 11 have the same effect on the light reflected by the different edges of the anode 6, and the brightness of the diffraction fringes formed by the reflection light having different colors is more uniformly distributed. Therefore, the diffraction fringes formed by the reflection light having different colors are more easily mixed into white light, and color separation phenomenon of the diffraction image of the panel is reduced.

In addition, referring to FIG. 6 again, a color filter 54 is provided at a side of the black matrix 11 facing away from the substrate 1. The color filter 54 and the light-emitting layer 7 covered by the color filter 54 have the same color. When the ambient light enters the panel, the color filter 54 is configured to filter out light that is different from the color of the color filter 54, thereby reducing the amount of ambient lights entering the panel, and further reducing diffraction phenomenon caused by ambient light.

Based on the same inventive concept, an embodiment of the present disclosure further provides a display device. FIG.

Figure 31:
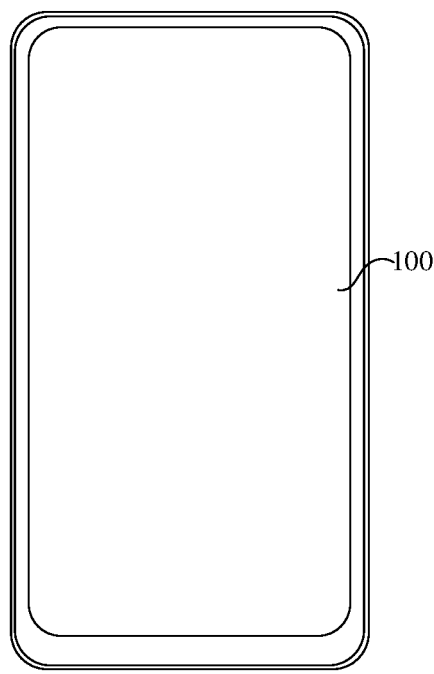
FIG. 31 is a structural schematic diagram showing a display device according to an embodiment of the present disclosure.

31 is a structural schematic diagram showing a display device according to an embodiment of the present disclosure. The display device includes the display panel 100 described above. The specific structure of the display panel 100 has been described in detail in the above embodiments, which is not elaborated herein. The display device shown in FIG. 31 is merely illustrative, and the display device may be any electronic device having a display function such as a mobile phone, a tablet computer, a laptop computer, an electronic paper book, or a television.

Finally, it should be noted that the above embodiments are only used to illustrate the technical solutions of the present disclosure, but not to limit them. Although the present disclosure has been described in detail with reference to the foregoing embodiments, those skilled in the art shall understand that the technical solutions recorded in the foregoing embodiments may still be modified, or some or all of the technical features may be equivalently replaced. These modifications or replacements do not make the essence of the corresponding technical solutions depart from the scope of technical solutions of the embodiments of the present disclosure.

What is claimed is:

1. A display panel, comprising:
   a substrate;
   an array layer located on the substrate and comprising a plurality of sub-pixels, wherein one sub-pixel of the a plurality of sub-pixels comprises a pixel drive circuit and a light-emitting element, the light-emitting element of the sub-pixel comprises an anode electrically connected to at least two trace lead-out ends, and at least two trace lead-out ends comprise a first trace lead-out end and at least one second trace lead-out end; the first trace lead-out end is connected to the pixel drive circuit by a corresponding connection trace; and
   a black matrix located at a side of the array layer facing away from the substrate and having a plurality of openings, wherein the anode of the light-emitting element of the sub-pixel is exposed in one of the plurality of openings;
   wherein a portion of the at least two trace lead-out end that is exposed in each of the plurality of openings is a connection end, the plurality of sub-pixels comprises a first sub-pixel and a second sub-pixel that have different light-emitting colors, wherein the connection end in the first sub-pixel is a first connection end, and the connection ends in the second sub-pixel is a second connection end, wherein the first sub-pixel comprises at least two first connection ends, and the second sub-pixel comprises at least two second connection ends, wherein extension directions of respective first connection ends are respectively parallel to an extension direction of one second connection end, and the first connection end and the second connection end have parallel extension directions, and the first connection end has equal angles and proportional sides relative to corresponding angles and sides of the second connection end;
   wherein the at least one first connection end and the at least one second connection end have one-to-one correspondence; and an extension direction of an $i^{th}$ first connection end is parallel to an extension direction of an $i^{th}$ second connection end, and the $i^{th}$ first connection end has equal angles and proportional sides relative to corresponding angles and sides of the $i^{th}$ second connection end;
   wherein the anode has a rectangular or an n-regular polygonal shape, and $n \geq 5$;
   the anode comprises a first side, the first sides of anodes in respective sub-pixels are parallel to each other, the first side has a first endpoint and a second endpoint, and directions from the first endpoint to the second endpoint in the sub-pixels are the same;
   an $x^{th}$ first connection end protrudes from the first side of the anode, a midpoint of a portion of the first side that overlaps with an edge of the $x^{th}$ first connection end is a first end lead-out point, a distance between the first end lead-out point and the first endpoint is a first distance, and a ratio of the first distance to a length of the first side is a first ratio;
   an $x^{th}$ second connection end protrudes from the first side of the anode, the midpoint of the portion of the first side that overlaps with an edge of the $x^{th}$ second connection end is a second end lead-out point, a distance between the second end lead-out point and the first endpoint is a second distance, and a ratio of the second distance to the length of the first side is a second ratio; and
   the first ratio corresponding to the $x^{th}$ first connection end is equal to the second ratio corresponding to the $x^{th}$ second connection end, and a value of x is one or more selected from the number of the at least one first connection end or the number of the at least one second connection end.

2. The display panel according to claim 1, wherein the first sub-pixel and the second sub-pixel have different light-emitting colors, and a pattern of the anode of the first sub-pixel has angles and sides that are equal to corresponding angles and sides of the pattern of the anode of the second sub-pixel;
   the anode and the connection ends connected to the anode constitute a reflective electrode; and
   a pattern of the reflective electrode of the first sub-pixel, after being translated, overlaps with a pattern of the reflective electrode of the second sub-pixel.

3. The display panel according to claim 1, wherein the first sub-pixel and the second sub-pixel have different light-emitting colors, and a pattern of the anode of the first sub-pixel, has equal angles and proportional sides relative to corresponding angles and sides of a pattern of the anode of the second sub-pixel.

4. The display panel according to claim 1, wherein the connection end is symmetrical about a first symmetry axis, and the first symmetry axis passes through a center point of the anode.

5. The display panel according to claim 4, wherein the anode has a rectangular shape; and
   the anode comprises a first edge extending in a first direction and a second edge extending in a second direction, the connection end protrudes from the first edge of the anode, and the connection end has a rectangular shape, the connection end is symmetrical about the first symmetry axis, the first symmetry axis is parallel to the second direction, and the first direction intersects with the second direction.

6. The display panel according to claim 4, wherein the anode has a regular hexagonal shape; and
   the anode comprises a third edge, a fourth edge, and a fifth edge that are sequentially connected to one another, the connection end protrudes from the anode from a top corner defined by the third edge and the fourth edge of the anode, an edge of the connection end that intersects with the third edge and the fourth edge is parallel to the fifth edge, the connection end is symmetrical about the first symmetry axis, and the first symmetry axis is parallel to the fifth edge.

7. The display panel according to claim 1, wherein the at least two trace lead-out end is one trace lead-out end, and the at least one connection end is one connection end.

8. The display panel according to claim 7, wherein the array layer further comprises a planarization layer located between the pixel drive circuit and the light-emitting element, and wherein the planarization layer is provided with a through hole through which the connection trace is electrically connected to the pixel drive circuit; and wherein the anode has a first side and a second side opposite to the first side in a second direction are, in a direction perpendicular to a plane of the substrate, an orthographic projection of the connection end and an orthographic projection of the through hole are located at the first side of an orthographic projection of the anode.

9. The display panel according to claim 1, wherein the sub-pixel comprises a first color sub-pixel, a second color sub-pixel, and a third color sub-pixel that have different light-emitting colors, the first sub-pixel and the second sub-pixel are any two of the first color sub-pixel, the second color sub-pixel, and the third color sub-pixel;

the display panel further comprises a first sub-pixel column and a second sub-pixel column that are alternately arranged in a first direction, the first sub-pixel column comprises a plurality of first pixel units arranged in a second direction, one of the plurality of pixel units comprises the first color sub-pixel, the second color sub-pixel, and the third color sub-pixel that are arranged along the second direction, the second sub-pixel column comprises a plurality of second pixel units arranged in the second direction, one of the plurality of second pixel units comprises the third color sub-pixel, the first color sub-pixel, and the second color sub-pixel that are arranged along the second direction, wherein $k^{th}$ sub-pixels in the first sub-pixel column and the second sub-pixel column are staggeringly arranged in the first direction, and the second direction intersects with the first direction, where $k \geq 1$; and the anode is electrically connected to the connection end, the anode and the connection end connected to the anode constitute a reflective electrode, the reflective electrode is symmetrical about a second symmetry axis, and the second symmetry axis is parallel to the second direction.

10. The display panel according to claim 1, wherein the sub-pixel comprises a first color sub-pixel, a second color sub-pixel, and a third color sub-pixel that have different light-emitting colors, the first sub-pixel and the second sub-pixel are any two of the first color sub-pixel, the second color sub-pixel, and the third color sub-pixel;

the display panel further comprises a third sub-pixel column and a fourth sub-pixel column that are alternately arranged in a first direction, in the third sub-pixel column, the third color sub-pixel and the first color sub-pixel are alternately arranged in a second direction, the fourth sub-pixel column comprises a plurality of second color sub-pixels arranged in the second direction, in two adjacent second color sub-pixels of the plurality of second color sub-pixels, a pattern of the anode in a former second color sub-pixel after being rotated 90° clockwise and then translated overlaps with a pattern of the anode in a latter second color sub-pixel; $k^{th}$ sub-pixels in the third sub-pixel column and the fourth sub-pixel column are staggeringly arranged in the first direction X, and the second direction Y intersects with the first direction X, where $k \geq 1$; and the anode is electrically connected to one of the connection ends, the anode and the connection end connected to the anode constitute a reflective electrode, the reflective electrode is symmetrical about a third symmetry axis, the third symmetry axis is parallel to the third direction, and the third direction intersects with the first direction and the second direction, respectively.

11. The display panel according to claim 1, wherein the opening has equal angles and proportional sides relative to corresponding angles and sides of the anode located in the opening.

12. A display device comprising a display panel according to claim 1.

13. A display panel, comprising:

a substrate;

an array layer located on the substrate and comprising a plurality of sub-pixels, wherein one sub-pixel of the a plurality of sub-pixels comprises a pixel drive circuit and a light-emitting element, the light-emitting element of the sub-pixel comprises an anode electrically connected to at least two trace lead-out ends, and at least two trace lead-out ends comprise a first trace lead-out end and at least one second trace lead-out end; the first trace lead-out end is connected to the pixel drive circuit by a corresponding connection trace; and a black matrix located at a side of the array layer facing away from the substrate and having a plurality of openings, wherein the anode of the light-emitting element of the sub-pixel is exposed in one of the plurality of openings; wherein a portion of the at least two trace lead-out ends that is exposed in each of the plurality of openings is a connection end, the plurality of sub-pixels comprises a first sub-pixel and a second sub-pixel that have different light-emitting colors, wherein the connection end in the first sub-pixel is a first connection end, and the connection ends in the second sub-pixel is a second connection end, wherein the first sub-pixel comprises at least two first connection ends, and the second sub-pixel comprises at least two second connection ends, wherein extension directions of respective first connection ends are respectively parallel to an extension direction of one second connection end, and the first connection end and the second connection end have parallel extension directions, and the first connection end has equal angles and proportional sides relative to corresponding angles and sides of the second connection end;

wherein the anode and M connection ends connected to the anode constitute a reflective electrode; and a pattern of the reflective electrode of the first sub-pixel, has equal angles and proportional sides relative to corresponding angles and sides of a pattern of the reflective electrode of the second sub-pixel;

wherein the array layer further comprises a planarization layer located between the pixel drive circuit and the light-emitting element, and the planarization layer is provided with a through hole through which the connection trace is electrically connected to the pixel drive circuit; and a line width of the first connection end is smaller than a line width of the second connection end, and a distance between the first connection end and the through hole corresponding to the first connection end is smaller than a distance between the second connection end and the through hole corresponding to the second connection end.

\* \* \* \* \*